(12) United States Patent
Krusin-Elbaum et al.

(10) Patent No.: US 7,692,959 B2
(45) Date of Patent: Apr. 6, 2010

(54) MULTILAYER STORAGE CLASS MEMORY USING EXTERNALLY HEATED PHASE CHANGE MATERIAL

(75) Inventors: Lia Krusin-Elbaum, Dobbs Ferry, NY (US); Bruce G Elmegreen, Goldens Bridge, NY (US); Dennis M. Newns, Yorktown Heights, NY (US); Xinlin Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 12/107,338

(22) Filed: Apr. 22, 2008

(65) Prior Publication Data

US 2009/0262572 A1 Oct. 22, 2009

(51) Int. Cl.
*G11C 11/00* (2006.01)
(52) U.S. Cl. .................. 365/163; 365/113; 365/175
(58) Field of Classification Search ............. 365/63, 365/105, 113, 163, 173, 175
See application file for complete search history.

(56) References Cited

U.S. PATENT DOCUMENTS

| | | | |
|---|---|---|---|
| 5,406,509 | A | 4/1995 | Ovshinsky et al. |
| 6,839,263 | B2 * | 1/2005 | Fricke et al. .............. 365/63 |
| 7,045,421 | B2 | 5/2006 | Rueckes et al. |
| 7,221,579 | B2 | 5/2007 | Krusin-Elbaum et al. |
| 7,283,383 | B2 * | 10/2007 | Kang ..................... 365/148 |
| 2005/0211978 | A1 | 9/2005 | Bu et al. |
| 2007/0131980 | A1 | 6/2007 | Lung |
| 2007/0187744 | A1 | 8/2007 | Kreupl |

OTHER PUBLICATIONS

Yi Zhang, Jie Feng, Yin Zhang, Zufa Zhang, Yinyin Lin, Ting'ao Tang, Bingchu Cai and Bomy Chen, "Multi-Bit Storage In Reset Process Of Phase-Change Random Access Memory (PRAM)", Phys. Stat. Sol. (RRL), 2007, pp. R28-R30, No. 1, Wiley-VCH Verlag GmbH & Co. KGaA, Weinheim.

* cited by examiner

*Primary Examiner*—Gene N. Auduong
(74) *Attorney, Agent, or Firm*—Cantor Colburn LLP; Vazken Alexanian

(57) ABSTRACT

A multi-layer, phase change material (PCM) memory apparatus includes a plurality of semiconductor layers sequentially formed over a base substrate, wherein each layer comprises an array of memory cells formed therein, each memory cell further including a PCM element, a first diode serving as a heater diode in thermal proximity to the PCM element and configured to program the PCM element to one of a low resistance crystalline state and a high resistance amorphous state, and a second diode serving a sense diode for a current path used in reading the state of the PCM element; the base substrate further including decoding, programming and sensing circuitry formed therein, with each of the plurality of semiconductor layers spaced by an insulating layer; and intralayer wiring for communication between the base substrate circuitry and the array of memory cells in each of the semiconductor layers.

20 Claims, 23 Drawing Sheets

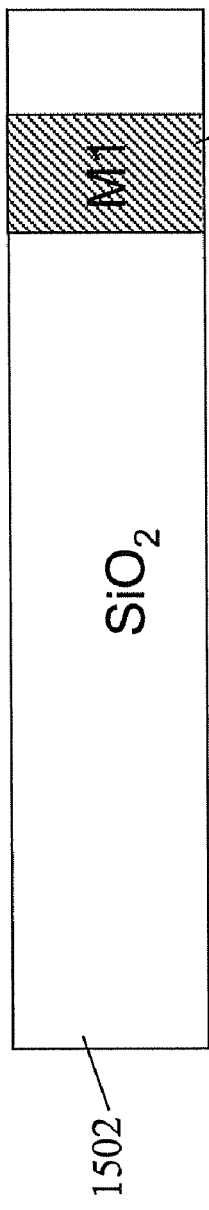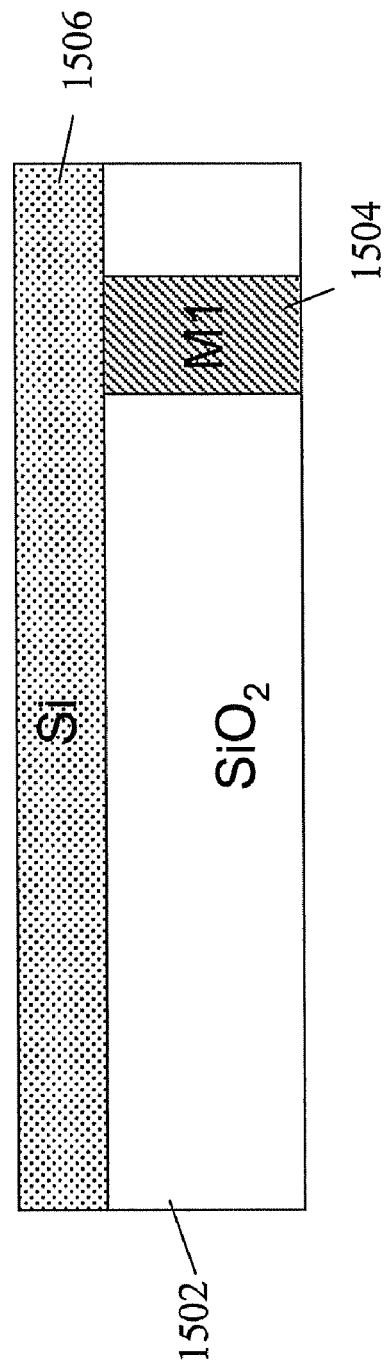
Fig. 15(a)
Fig. 15(b)

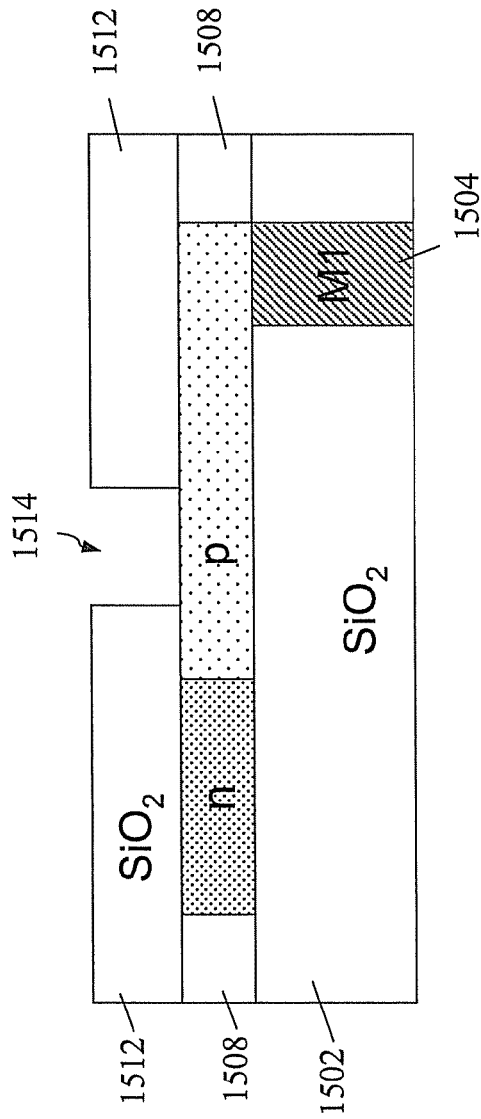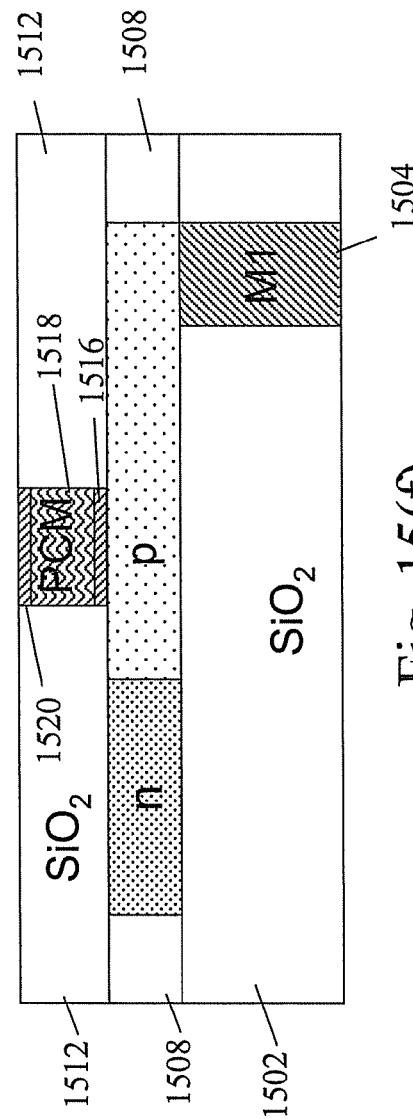
Fig. 15(e)
Fig. 15(f)

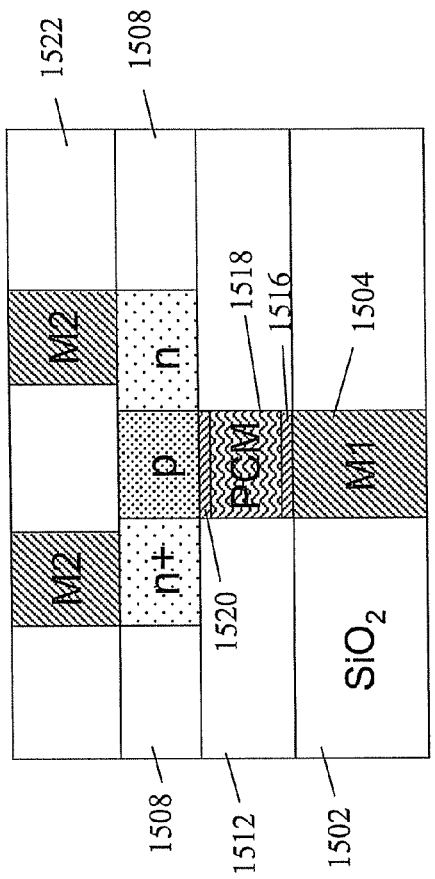
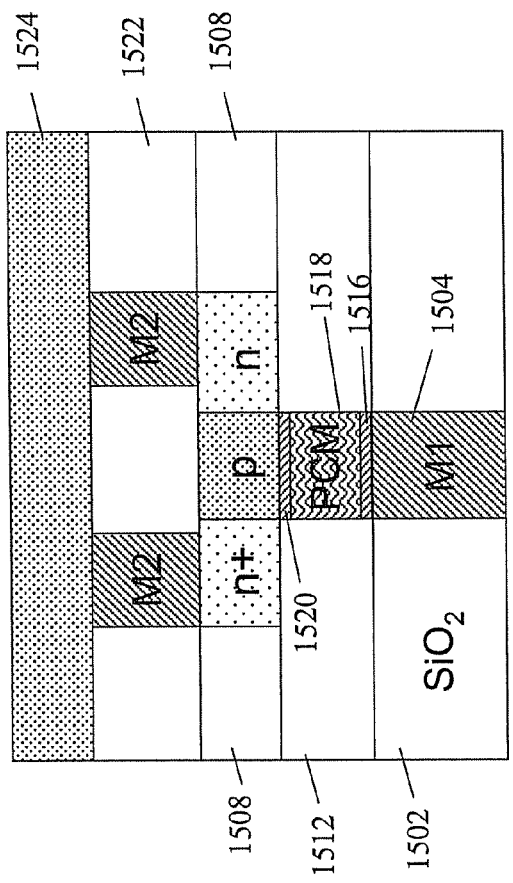
Fig. 17(f)
Fig. 17(g)

MULTILAYER STORAGE CLASS MEMORY USING EXTERNALLY HEATED PHASE CHANGE MATERIAL

BACKGROUND

The present invention relates generally to integrated circuit memory devices and, more particularly, to a multi-layer, storage class memory using an externally heated phase change material.

There are numerous contemporary applications where a compact, non-volatile memory with no moving parts would be an enabling technology. Such examples include portable computing and communication devices, computers that use low power, etc. Current techniques for achieving non-volatile memory include magnetic random access memory (MRAM), FLASH, and ferroelectric random access memory (FeRAM). At the present time, the capacities and speeds of these memories in practical devices are comparable with the capacities of dynamic random access memory (DRAM) chips, which is a volatile type of memory that requires continuous power in order to retain the data therein. In addition, DRAM is also relatively slow. Regardless, none of these types of memory described above can compete with the high volumes in disk storage.

A new technology, Phase Change Material (PCM), is now becoming available and seems well-suited for non-volatile memory technology. The phase change material is typically a ternary alloy of germanium (Ge), antimony (Sb) and tellurium (Te) (GST), with a typical composition being $Ge_2Sb_2Te_5$, also referred to as GST 225. The GST material is interconvertible between two discrete states, amorphous (high electrical resistance) and crystalline (low electrical resistance), thereby enabling data storage therein. The interconversion or write process is done by thermal cycling of the PCM.

The challenge in any storage class memory, including those formed from PCM elements, is the achievement of ultra-high storage densities. Accordingly, it would be desirable to be able to provide a PCM memory device with an ultra-high storage density characterized by an aggressively low footprint memory cell.

SUMMARY

The foregoing discussed drawbacks and deficiencies of the prior art are overcome or alleviated by a multi-layer, phase change material (PCM) memory apparatus, including a plurality of semiconductor layers sequentially formed over a base substrate, wherein each layer comprises an array of memory cells formed therein, each memory cell further comprising a PCM element, a first diode serving as a heater diode in thermal proximity to the PCM element and configured to program the PCM element to one of a low resistance crystalline state and a high resistance amorphous state, and a second diode serving a sense diode for a current path used in reading the state of the PCM element; the base substrate further comprising decoding, programming and sensing circuitry formed therein, with each of the plurality of semiconductor layers spaced by an insulating layer; and intralayer wiring for communication between the base substrate circuitry and the array of memory cells in each of the semiconductor layers.

In another embodiment, a method of forming a multi-layer, phase change material (PCM) memory device includes sequentially forming a plurality of semiconductor layers over a base substrate, wherein each layer comprises an array of memory cells formed therein, each memory cell further comprising a PCM element, a first diode serving as a heater diode in thermal proximity to the PCM element and configured to program the PCM element to one of a low resistance crystalline state and a high resistance amorphous state, and a second diode serving a sense diode for a current path used in reading the state of the PCM element; forming decoding, programming and sensing circuitry in the base substrate, with each of the plurality of semiconductor layers spaced by an insulating layer; and forming intralayer wiring for communication between the base substrate circuitry and the array of memory cells in each of the semiconductor layers.

BRIEF DESCRIPTION OF THE DRAWINGS

Referring to the exemplary drawings wherein like elements are numbered alike in the several Figures:

FIG. 4($b$) is a top view of the diode and PCM devices of FIG. 4($a$);

DETAILED DESCRIPTION

Disclosed herein is a multi-layer memory wherein each layer comprises an array of memory cells formed in a polysilicon material, with each cell including a PCM element, a first diode serving as a heater in order to interconvert the PCM phases, and a second diode serving a sense diode for a current path when reading the state of the PCM element. This multilayer memory design, due to the extremely small footprint of the memory cell, has a storage capability in the tens of Gigabytes range. As described in further detail herein after, several types of array cell arrangements (with respect to the diode/PCM configuration) are contemplated.

Phase Change Materials

Certain phase change materials (such as Ge—Sb—Te (GST) alloys) have a programmable electrical resistance that changes with temperature. Other compositions such as $GeSb_4$ and more generally $Ge_xSb_y$, (including substitution/addition of other elements) are also possible for the phase change materials. Individual phase change elements (PCE) are thus used as programmable eFUSEs or as the storage cells of a memory device. The state of an individual PCE is programmed through a heating and cooling process which is electrically controlled by passing a current through the PCE (or a discrete heating element in proximity to the PCE) and the resulting ohmic heating that occurs. Depending upon the specific applied temperature and duration of heating applied to the PCE element, the structure is either "set" to a lower resistance crystalline state or "reset" to an amorphous, higher resistance state. Essentially, there is no practical limit to the number of times a PCE may be programmed from the crystalline state to the amorphous state and vice versa.

The changing of the phase of a PCE typically requires a high temperature (e.g., considerably above the PCM melting temperature of about 600° C.), as can be obtained by Joule heating from current flowing through the phase change material or discrete resistor. When the phase change material is heated above its melting temperature to thereafter be quickly cooled, the phase change material becomes amorphous to result in a severed electrical connection in the case of an eFUSE, or to store a data bit of one logical value in the case of a memory element. Alternatively, when the phase change material is heated above its crystallization temperature and maintained at that temperature for a predetermined time before cooling, the phase change material becomes crystalline to result in a restored electrical connection in the case of an eFUSE, or to store a data bit of the opposite logical value in the case of a memory element.

Figure 1:
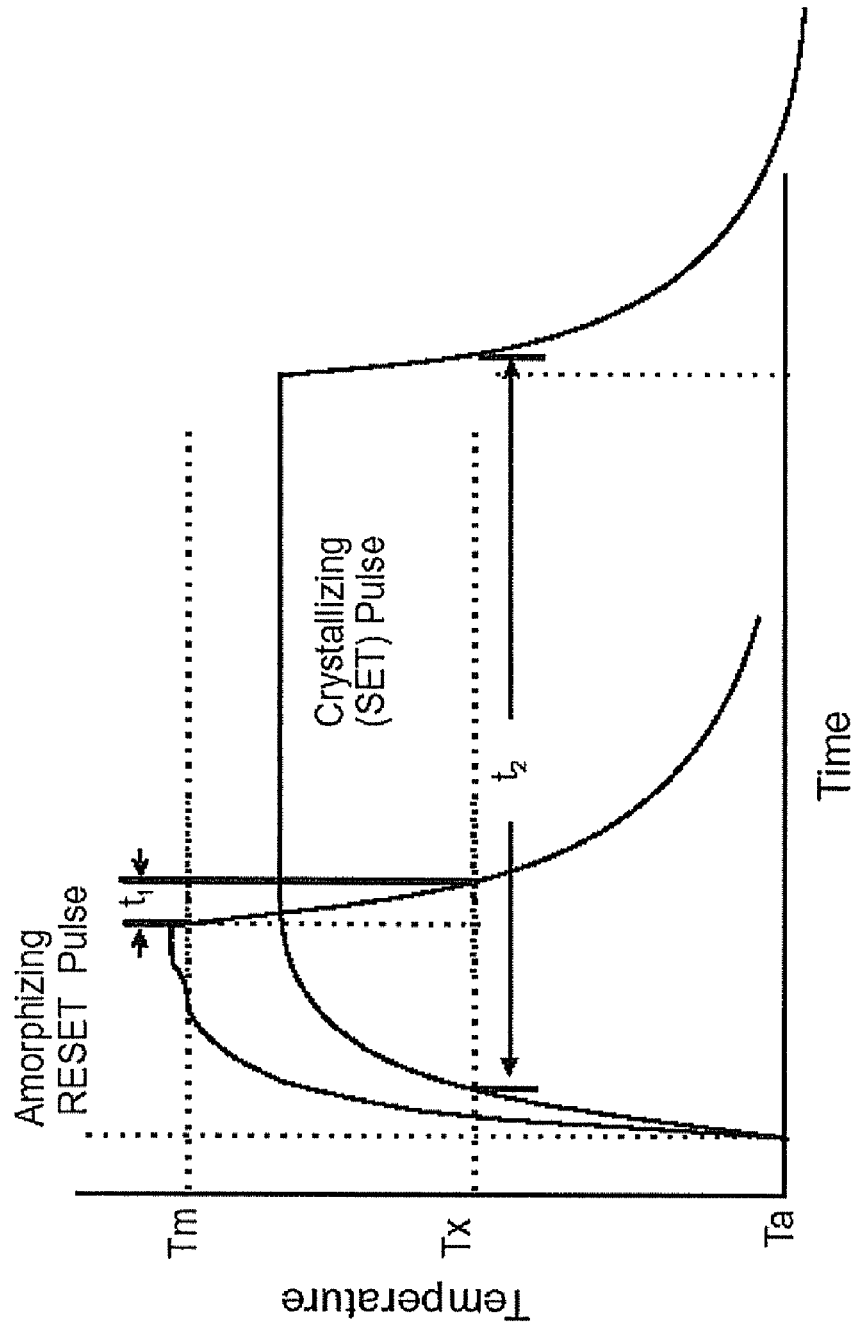
FIG. 1 is a graph illustrating the exemplary thermal cycling operations of a phase change material.

More specifically, FIG. 1 is a graph illustrating the exemplary thermal cycling operations of a phase change material. As is illustrated, a first thermal cycling operation includes a "RESET" pulse for converting the PCM from crystalline to amorphous form, and a second thermal cycling operation includes a "SET" pulse for converting the PCM from amorphous to crystalline form. During the RESET pulse, the temperature of the PCM is raised above its melting temperature ($T_m$), followed by a rapid quench over a short time $t_1$. As a result of the rapid quench, the disordered arrangement of atoms of the PCM due to the melt is retained. Thus, the PCM is left in an amorphous, high resistive state after the RESET pulse. During the SET pulse, the PCM is annealed at a lower temperature with respect to the melting temperature, and for a longer time $t_2$ with respect to $t_1$. This process enables the amorphous form to crystallize into a lower resistive state.

Design Requirements and Proposed Solutions

Some of the design requirements for a robust PCM-based storage-class memory include: (1) the device must functionally perform the SET and RESET operations for a large number of cycles, (e.g., $10^{11}$) and a read capability of the device state must also be provided; (2) power/current requirements should not be excessive; (3) to avoid contamination of silicon components, the PCM memory layers should be located above the PC (silicon) level; (4) the density of memory units has to be very high, with a large number of them fitting on a chip; (5) the switching time has to be low.

Figure 2:
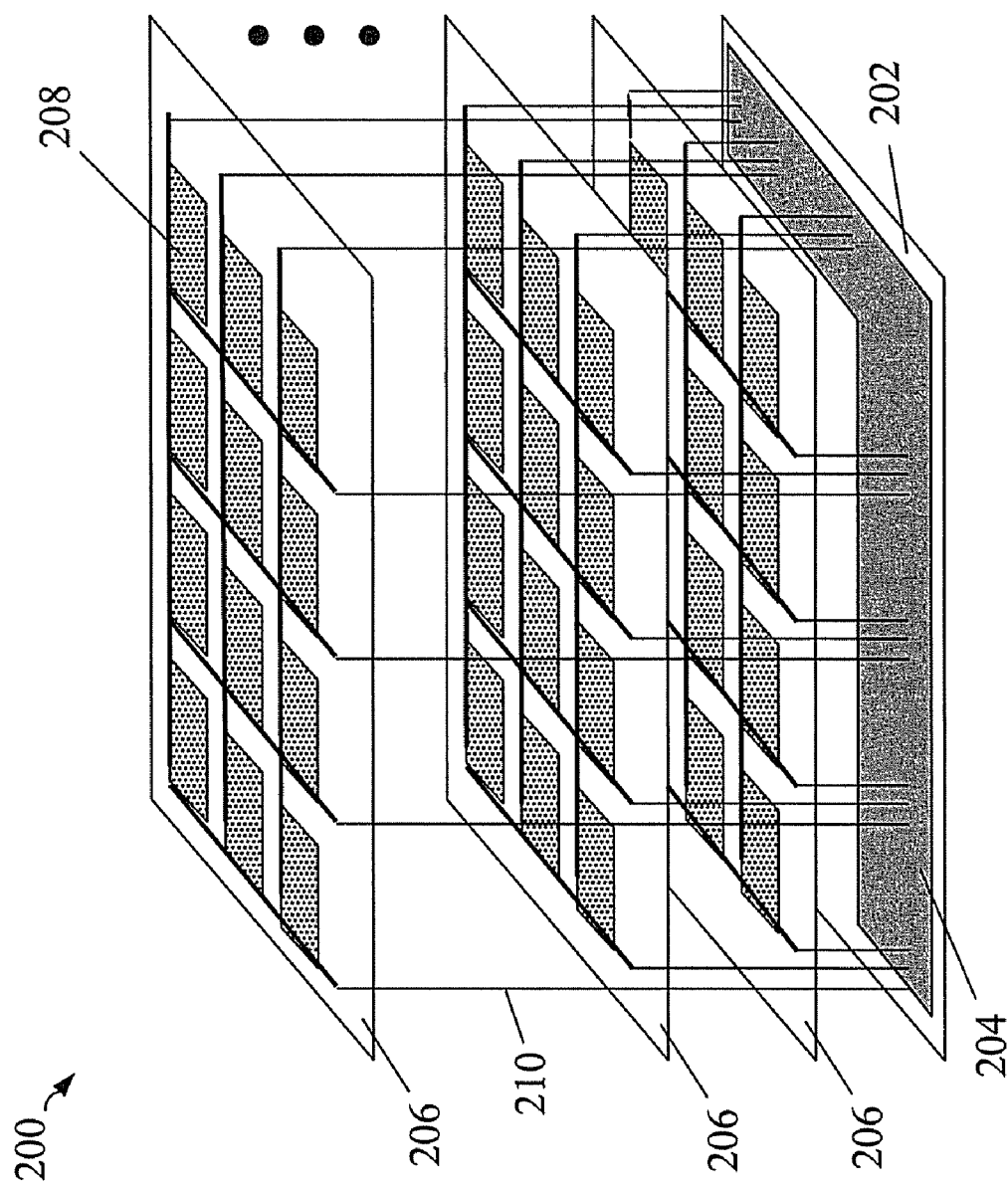
FIG. 2 is a schematic perspective view of a multi-layer, storage class memory using an externally heated phase change material, in accordance with an embodiment of the invention.

Referring now to FIG. 2, there is shown a schematic perspective view of a multi-layer, storage class memory 200 using an externally heated phase change material, in accordance with an embodiment of the invention. A base layer includes a substrate 202, such as crystalline silicon for example, upon which a region 204 of peripheral circuitry (e.g., CMOS decoding, programming and sensing devices) is located. In addition, a plurality of polysilicon layers 206 are sequentially formed over the substrate 202, each of the polysilicon layers 206 being spaced by a thin insulating layer such as oxide (not shown in FIG. 2). Each polysilicon layer 206 in turn includes an array of externally heated PCM memory cells 208 fabricated thereon, together with intralayer wiring 210 and portions of vias used for interlayer communication. A suitable planarization step follows the completion of each layer.

Each memory cell 208 is characterized by a relatively extremely low area (e.g., sub-DRAM) having externally-heated PCM device and a pair of diodes (the arrangement of which depends on a specific embodiment thereof. The PCM elements are "externally heated" in that the current used to generate the thermal cycling is not passed directly through the PCM elements themselves, but through an adjacent diode as illustrated in the exemplary array embodiments discussed below. More specifically, the memory plane includes cells containing arrangements of p-n junctions, together with PCM elements, heater and sense electrodes. The material surrounding the memory cells should be, for example, an electrical and thermal insulator with refractory properties, such as $SiO_2$. Not all memory cells will necessarily lie within a single polysilicon grain, leading to a possible malfunction of a fraction of the cells. However, following standard DRAM procedure, any malfunctioning cells will be detected and excluded from the operational memory.

With respect to the number of layers 206 (or "memory planes"), it is contemplated that, for example, 16 or more multiple memory planes of PCM arrays are incorporated into memory structure 200. In addition, the memory cell layers 206 are located above the PC-level (substrate 202) to avoid contamination. Instead, the logic multiplexing/demultiplexing and coding functions of the memory are incorporated at the PC-level.

FIRST EXEMPLARY EMBODIMENT

Figure 3:
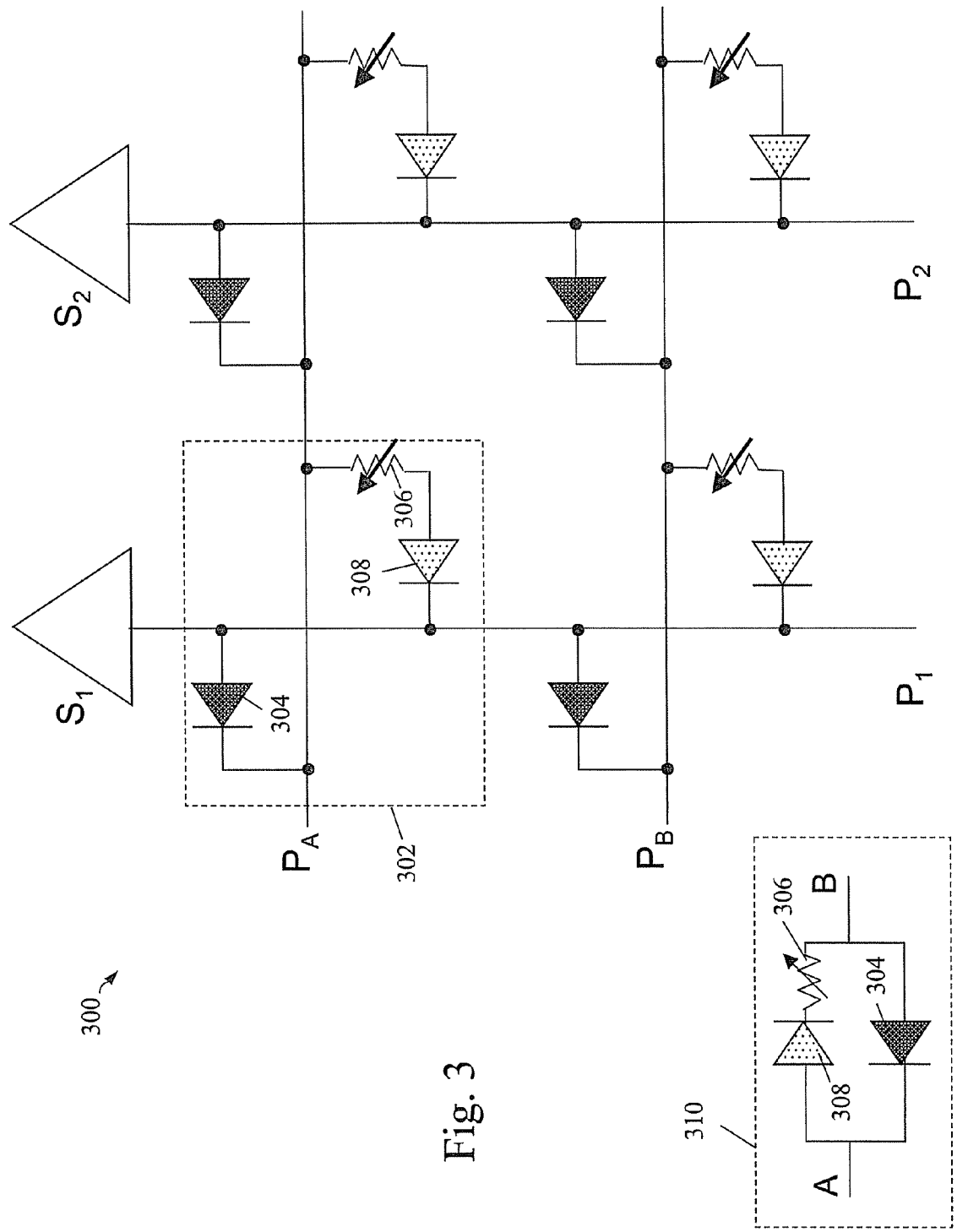
FIG. 3 is a schematic diagram of a crossbar array configuration for the multi-layer, storage class memory of FIG. 2, in accordance with an embodiment of the invention.

Referring now to FIG. 3, there is shown a schematic diagram of a crossbar array configuration 300 that may be utilized for each layer 206 of the multi-layer, storage class memory of FIG. 2, in accordance with a first embodiment of the invention. As is shown, the array 300 includes a plurality of unit cells 302 (which, for an actual device would represent a much greater number than the four depicted for purposes of simplicity), with each cell 302 including a first (heater) diode 304 in close thermal proximity with a PCM element 306. For example, as is the case with a DRAM array, the PCM array embodiments herein may be divided into N×N blocks, wherein N may be 256 or 512 for instance. Electrically, the PCM element 306 is in series with a second (sense) diode 308, the combination thereof being electrically in parallel with the heater diode 306. As perhaps best illustrated by the schematic insert 310 in FIG. 3, the heater diode 304 and sense diode 308 are biased in opposite directions.

For example, when current is passed in one direction through the parallel combination (e.g., from terminal B to terminal A), it passes through the heater diode 304 but not the sense diode 308. Through the close thermal contact between the heater diode 304 and the PCM element 306, the state of the PCM can be programmed using this direction of current flow. On the other hand, when current is passed in the opposite direction (from terminal A to terminal B), it does not pass through the heater diode 304 but does pass through the sense diode 308. Thereby, the resistance sensed in this last current path determines whether the PCM element 306 is in the amorphous (high resistance) or crystalline (low resistance) state. Additional information regarding heater and sense diodes in combination with a PCM may be found in U.S. Pat. No. 7,221,579, assigned to the assignee of the present application, and the contents of which are incorporated herein in their entirety.

With respect to programming and sensing of the exemplary array configuration 300 of FIG. 3, in order to program (write) the specific cell designated by 302 (top left), line $P_A$ is grounded and a positive voltage less than twice the diode threshold is applied to lines $P_1$, with the rest of the wires left floating. Since undesired current paths require a voltage larger than twice the diode threshold, current cannot flow through these paths. Conversely, to sense all cells in row A (for example), the array sense amplifiers ($S_1$, $S_2$, etc.) are grounded, and a low positive voltage is applied to line $P_A$, with the rest of the row lines ($P_B$, etc.) grounded. The resulting sense current will be respectively sensed by the array sense amplifiers $S_1$, $S_2$, etc.

Leakage currents may be estimated in terms of the memory block size, which is taken to be N×N elements (wherein N may be on the order of about 256 or 512, for example). The source of leakage is the voltage $V_{sense}$ on the vertical sense lines, each of which is leaked in the forward direction through N heater diodes 304 to ground. The leakage current of these N heater diodes 304 is in addition to the supply current for a given sense line, which is the sense current through an "ON" PCM element (e.g., on the order of about 0.1 mA to avoid a RESET of the PCM). The voltage $V_{sense}$ is very low (e.g., on the order of about 0.1 volts), so the leakage current will not significantly increase the load on the horizontal line drivers. As an example of a total leakage current, exemplary values tabulated below in Table I, which represent values for silicon CMOS diodes and, in one case, polysilicon, scaled to 50 nm diode sizes. The forward leakage currents in Table I at $V^F$=0.2 Volts is in the range of about $1\times10^{-12}$ A to about $2\times10^{-10}$ A; multiplying this value by 512 gives $5\times10^{-10}$ A to about $1\times10^{-7}$ A, which is much less than the 0.1 mA constraint discussed above.

TABLE I

Diode Leakage Currents (scaled to 50 nm width)

| Device | $I^F$ (bias V) A | $I^R$ (bias V) A | Doping | Ref |
|---|---|---|---|---|
| Si diode | — | $5 \times 10^{-17}$ (0.5 V) | $\sim 10^{18}$ | 1 |
| Si diode | — | $5 \times 10^{-12}$ (1 V) | $\sim 10^{21}$ | 2 |
| Si diode | $2 \times 10^{-10} \sim 1 \times 10^{-12}$ (0.2 V) | $3 \times 10^{-13}$ (0.2 V) | $1 \times 10^{18}$-$4 \times 10^{18}$, $1 \times 10^{19}$-$1 \times 10^{20}$ | 3 |
| Si diode | $3.2 \times 10^{-11}$ (0.2 V) | $2.17 \times 10^{-11}$ (0.2 V) | $1 \times 10^{20}$-$1 \times 10^{20}$ | 4 |
| Poly-Si diode | $2 \times 10^{-11}$ (0.2 V) | — | $5 \times 10^{19}$ | 5 |

Figure 4A:
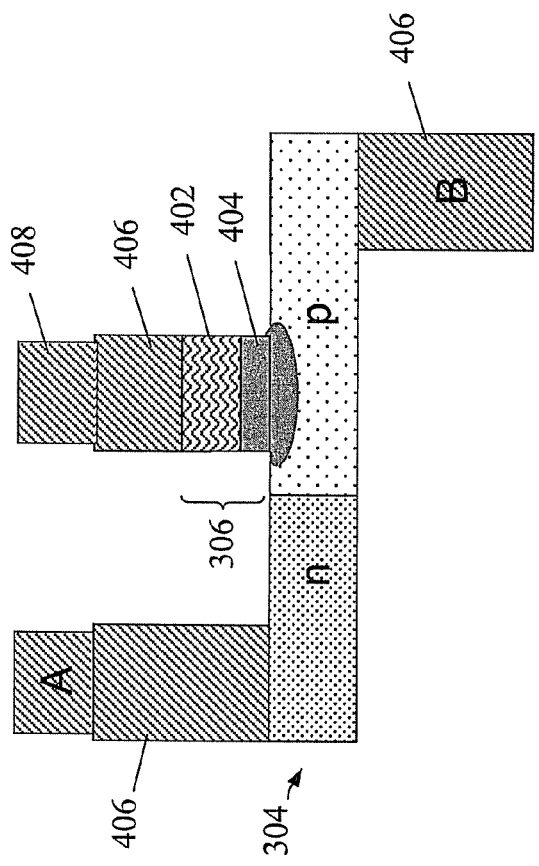
FIG. 4($a$) is a side cross sectional view of the diode and PCM devices comprising an exemplary unit cell in the crossbar array of FIG. 3.
Figure 4B:
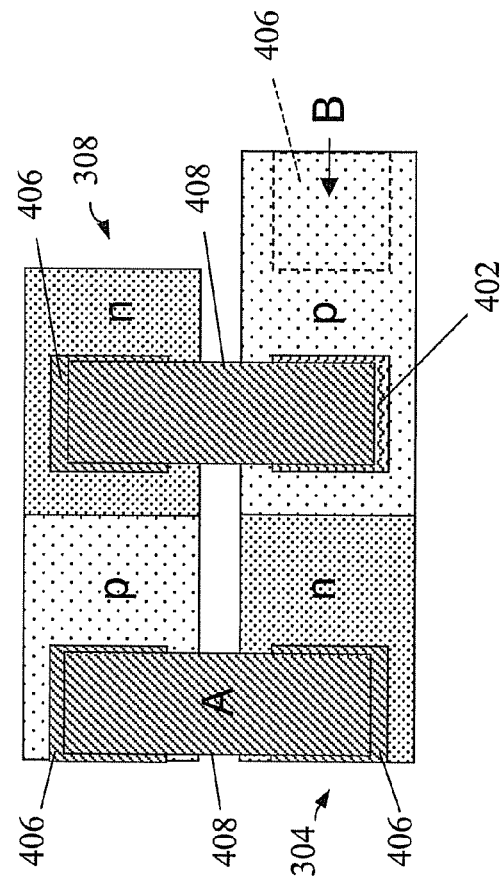

Referring now to FIGS. 4(a) and 4(b), there are shown side cross sectional and top views of the diode and PCM devices comprising the exemplary unit cell 302 in the crossbar array 300 of FIG. 3. As is shown, the p-doped region of heater diode 304 is in close thermal contact with the PCM element 306. More specifically, the PCM element 306 (having low resistance region 402 and thermally transformable region 404) is formed atop the p-doped region of heater diode 304. Vertical metallic vias 406 in combination with conductive lines 408 are used to electrically connect the diodes 304, 308 and the PCM 306 in the manner shown in the insert 310 of FIG. 3. It will also be noted that in the top view of FIG. 4(b), the location of the low resistance region 402 of the PCM 306 is depicted (instead of the via 406 formed directly above the PCM 306). From an area standpoint, the heater diode 304 and the sense diode 308 do not share a common n or p region; that is, the p/n regions of the heater diode 304 are laterally spaced apart from the n/p regions of the sense diode 308 in the polysilicon layer. An exemplary process flow for forming the unit cell structure shown in FIGS. 4(a) and 4(b) is presented hereinafter.

SECOND EXEMPLARY EMBODIMENT

Figure 5:
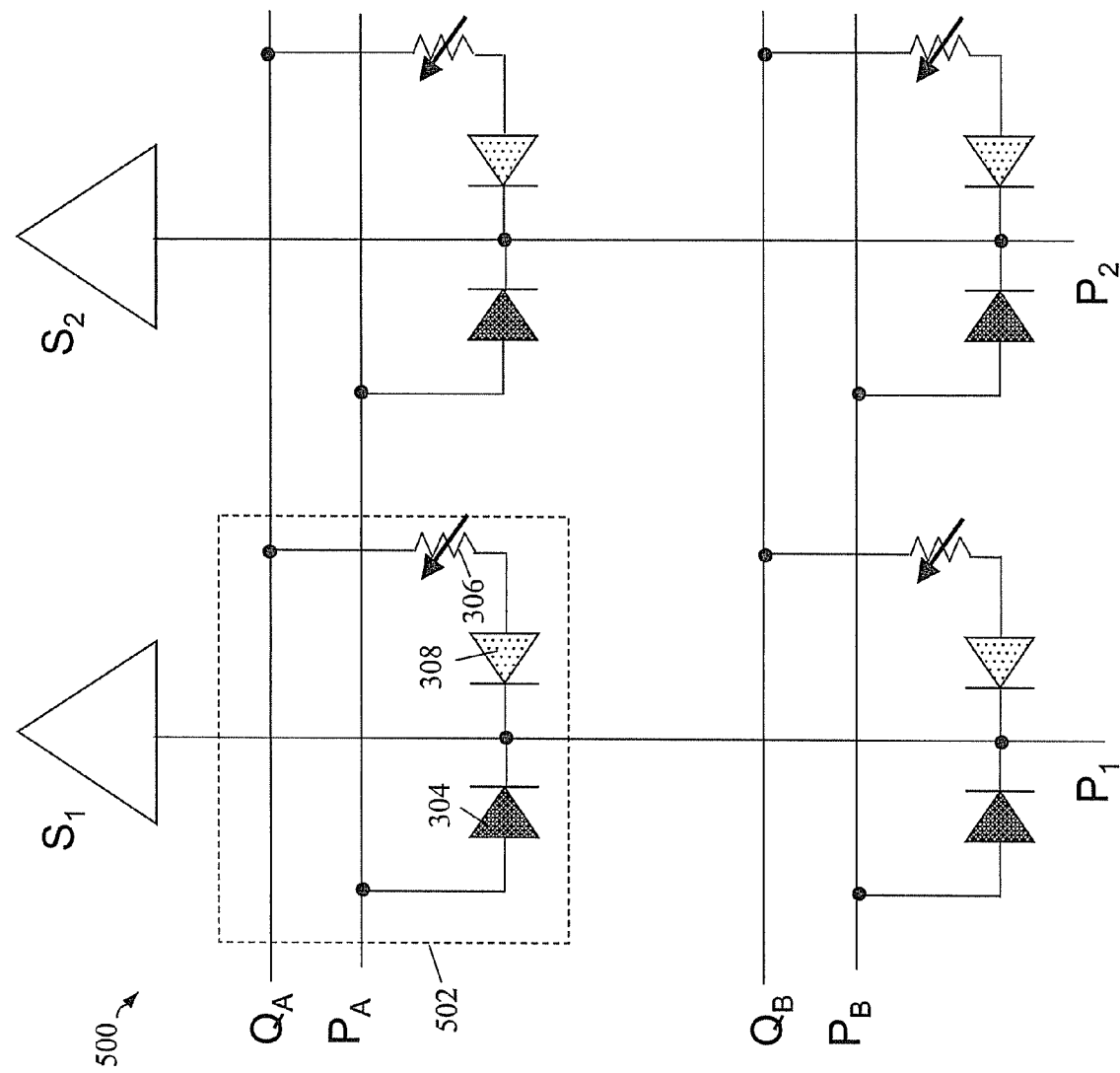
FIG. 5 is a schematic diagram of a p-n-p array configuration for the multi-layer, storage class memory of FIG. 2, in accordance with an alternative embodiment of the invention.

Referring now to FIG. 5, there is shown a schematic diagram of a p-n-p array configuration 500 that may alternatively be utilized for each layer 206 of the multi-layer, storage class memory of FIG. 2, in accordance with a second embodiment of the invention. As is shown, the array 500 includes a plurality of unit cells 502. Similar to the first embodiment, a unit cell 502 includes a first (heater) diode 304 in close thermal proximity with a PCM element 306. Electrically, the array 500 has a single vertical line for each column and a pair of horizontal lines for each row. The devices of the unit cell 502 are arranged in a p-n-p configuration, with the heater diode 304 and a sense diode 308 sharing an n-region in common with one another. The p-region of the sense diode 308 is in electrical and thermal contact with the PCM element 306, and the p-region of the heater diode 304 is doped at a higher concentration (p+) with respect to the p-region of the sense diode 308. The common n-region of each cell 502 is connected to the single vertical line ($P_1$, $P_2$, etc.) of its corresponding array column. In addition, the p-region of each heater diode 304 is coupled to one of the two horizontal lines in each array row ($P_A$, $P_B$ etc.) while the PCM element 306 is coupled to the other of the two horizontal lines in each array row ($Q_A$, $Q_B$ etc.). It should also be noted that in lieu of the p-n-p structure of FIG. 5, an n-p-n structure could equivalently be used.

In order to program (write) cell 502 of array 500, line $P_1$ is grounded and a positive voltage is applied to line $P_A$, with the rest of the lines allowed to float. The write current path is therefore from line $P_A$, through the heater diode 304, to the grounded line $P_1$. Conversely, to sense all cells in row A, each sense amplifier ($S_1$, $S_2$, etc.) is grounded and a low positive voltage is applied to line $Q_A$, with the remaining horizontal lines grounded. The resulting sense current will be sensed by sense amplifiers $S_1$, $S_2$, etc.

Leakage currents can be estimated once again in terms of the memory block size, N. The source of leakage is the voltage $V_{sense}$ on the vertical sense wires, each of which is leaked in the reverse direction in parallel through N heater diodes and N sense diodes to ground. The leakage current of these 2N diodes is in addition to the supply current for a given sense line, which is the sense current through an "ON" PCM element (e.g., on the order of about 0.1 mA to avoid a RESET of the PCM). The voltage $V_{sense}$ is very low (e.g., on the order of about 0.1 volts). Using a maximum reverse current in Table I above of $2\times10^{-11}$ A, and multiplying this value by 2N=$10^3$, the total leakage current is about $2\times10^{-8}$ A, which is much less than the sense drive current 0.1 mA of the ON device. Thus, the reverse leakage current will not significantly increase the load on the horizontal line drivers.

Figure 6:
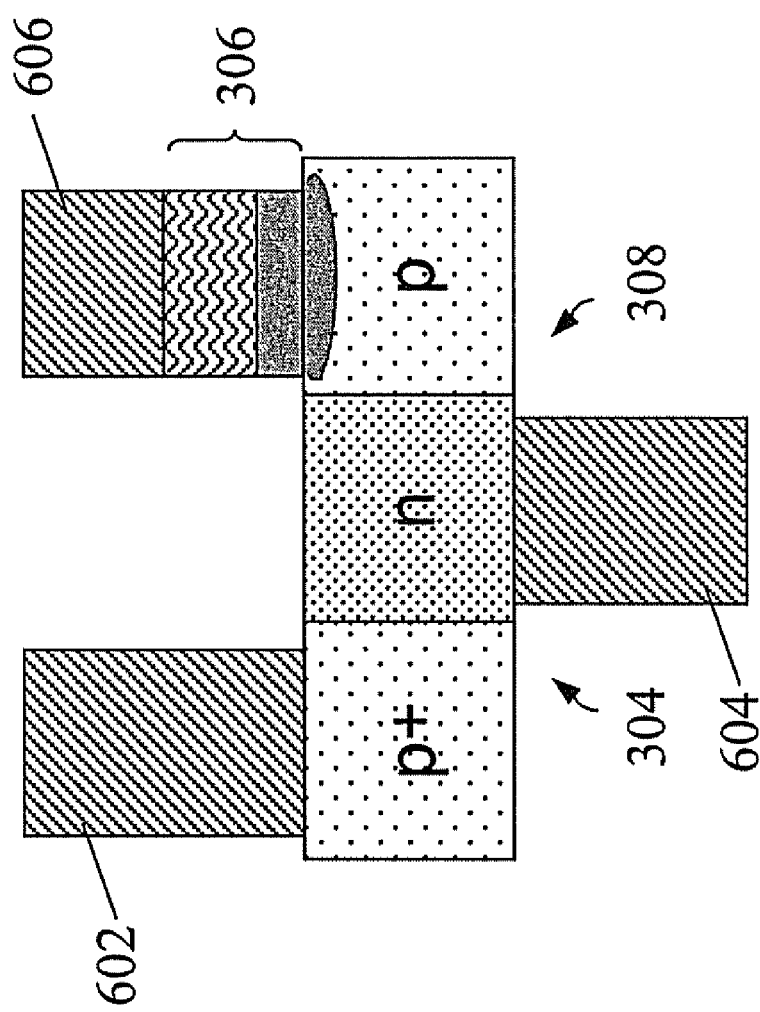
FIG. 6 is a side cross sectional view of the diode and PCM devices comprising an exemplary unit cell in the p-n-p array of FIG. 5.

FIG. 6 is a side cross sectional view of the diode and PCM devices comprising an exemplary unit cell 502 in the p-n-p array 500 of FIG. 5. As is shown, the heater diode 304 is formed by the p+ region, the n-region, a top heater terminal 602 and a bottom common terminal 604, with the PCM element 306 in close thermal contact with the heater diode 302 due to the high thermal conductivity of polysilicon. The sense diode 308 is formed by the p-region, the n-region, a top sense terminal 606 and the bottom common terminal 604, and connected electrically in series with the PCM element 306. An exemplary process flow for forming the unit cell structure shown in FIG. 6 is presented hereinafter.

THIRD EXEMPLARY EMBODIMENT

Figure 7:
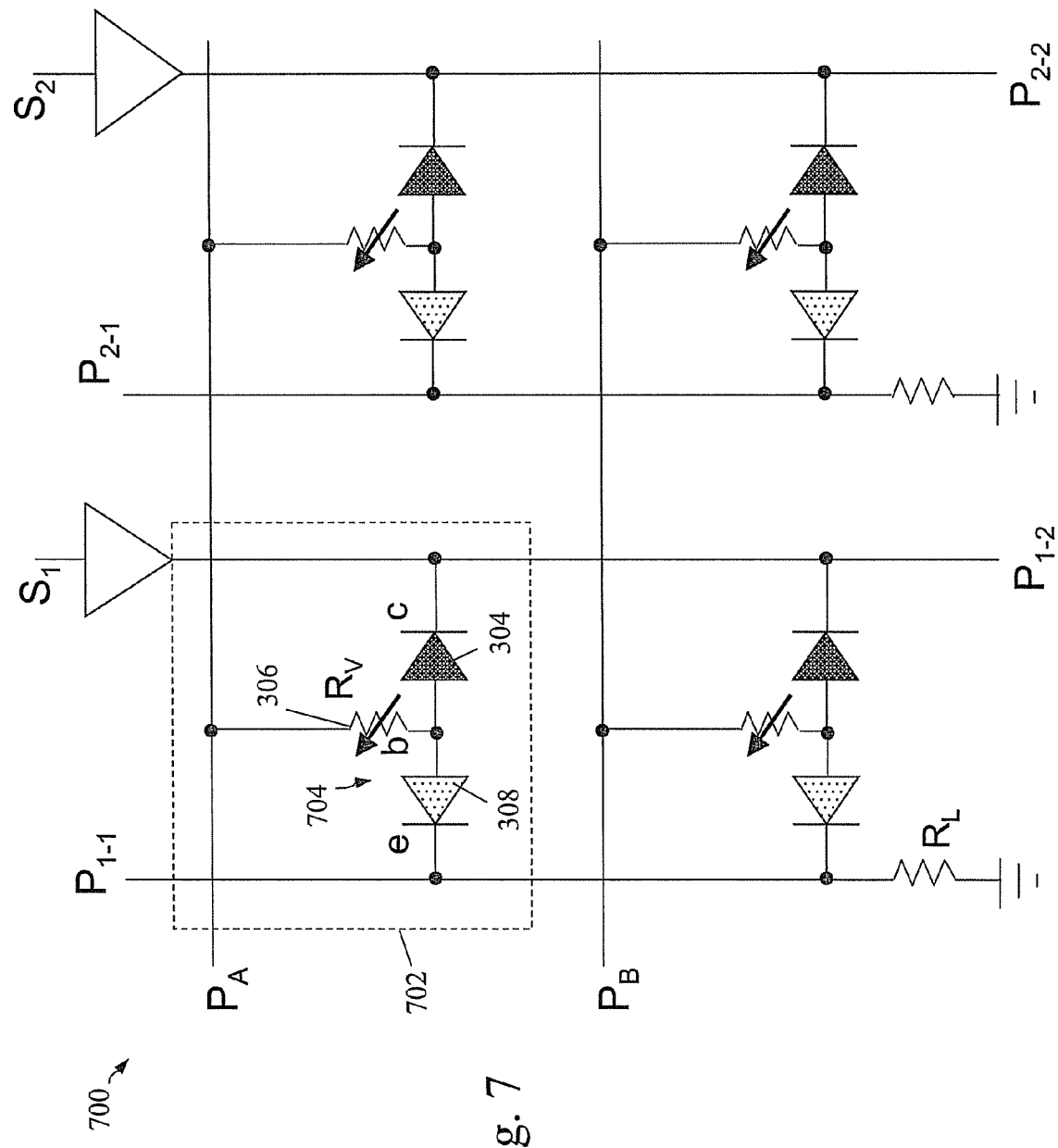
FIG. 7 is a schematic diagram of a bipolar transistor array configuration for the multi-layer, storage class memory of FIG. 2, in accordance with an alternative embodiment of the invention.

Referring now to FIG. 7, there is shown a schematic diagram of a bipolar transistor configuration 700 that may alternatively be utilized for each layer 206 of the multi-layer, storage class memory of FIG. 2, in accordance with a third embodiment of the invention. As is shown, the array 700 includes a plurality of unit cells 702. Similar to the first and second embodiments, a unit cell 702 includes a first (heater) diode 304 in close thermal proximity with a PCM element 306. Electrically, the array 700 has a single horizontal line for each row and a pair of vertical lines for each column. The devices of the unit cell 702 are arranged in an n-p-n configuration, with the heater diode 304 and a sense diode 308 sharing a p-region in common with one another, which serves a base region of an n-p-n bipolar transistor 704 that is operated as an emitter follower.

The p-region (base) of the transistor 704 is in electrical and thermal contact with the PCM element 306, with base-collector (b-c) junction of the transistor 704 comprising the heater diode 304. Conversely, the base-emitter junction of the transistor 704 comprises the sense diode 308. The emitter (n+) region of the transistor 704 is doped at a higher concentration with respect to the n-region of the collector. Electrically speaking, the common p-region (base) of each cell 502 is connected to the single horizontal line ($P_A$, $P_B$, etc.) of its corresponding array row. In addition, the n-region of each sense diode 308 (i.e., the emitter) is coupled to one of the two vertical lines in each array row ($P_{1-1}$, $P_{2-1}$, etc.) while the n-region of each heater diode 304 (i.e., the collector) is coupled to the other of the two vertical lines in each array row ($P_{1-2}$, $P_{2-2}$, etc.). It should also be noted that in lieu of the n-p-n structure of FIG. 7, a p-n-p transistor structure could equivalently be used.

In order to program (write) cell 702 of array 700, a positive voltage is applied to line $P_A$, a larger positive voltage is applied to line $P_{1-2}$, with the remaining horizontal lines grounded, the S lines floating, and the remaining $P_{i-j}$ lines floating. This drives a large current through the heater diode 304. When the voltage is turned off quickly, the PCM 306 is written to the high resistance amorphous state; when the voltage is turned off relatively slowly, the PCM 306 is written to the low resistance crystalline state. A variable load resistor $R_L$ coupled to the emitter terminal of each transistor cell is adjusted so that appropriate currents flow through the transistor in the SET and RESET phases. In an exemplary embodiment load resistor $R_L$ is also a PCM element that can be written to either a low resistance crystalline state or a high resistance amorphous state.

In order to sense all cells in a given row (e.g., row A), a small positive voltage is applied to line $P_A$, and a large positive voltage is applied to $S_1$, $S_2$, etc. The remaining horizontal lines are grounded and the $P_{1-2}$, $P_{2-2}$ etc. lines float. The resulting current through the current sense amplifiers $S_1$, $S_2$, etc. is then measured. In addition, the variable resistance $R_L$ should be low (crystalline) during a read operation to reduce the negative feedback as discussed below. The transistor is assumed to have a large $\beta \sim 100$. The collector current is large for ON devices, and small for OFF devices, wherein the ratio of currents depends on the PCM ON/OFF resistance ratio but is stabilized by the emitter resistor $R_L$.

Leakage currents in bipolar transistor array 700 can affect the sensing of an OFF state PCM cell. Direct leakage through the collector emitter path of N OFF transistors on a vertical collector line will be sensed as a false ON if the leakage current is comparable with the current generated by an ON transistor with an ON PCM cell in its base circuit. The condition for leakage current to cause a false ON is that N/$\beta$ times the leakage current (where $\beta$ is the transistor current gain) be comparable with the base current through an ON state PCM element. Typically, reverse leakage currents for a given device are significantly less than forward leakage currents, so it is assumed that that the collector-emitter path leakage will be controlled by the reverse direction leakage, which is the bottleneck. Using a maximum reverse current in Table I of $I^R = 2 \times 10^{-11}$ A, and taking $\beta = 20$, N $I^R/\beta = 5 \times 10^{-10}$ A, which must be much less than the ON current, $\sim 10^{-4}$ A, a condition which is clearly satisfied. In addition, the impact of this leakage on driver power is also small, as shown by similar analyses in the foregoing sections.

Figure 8:
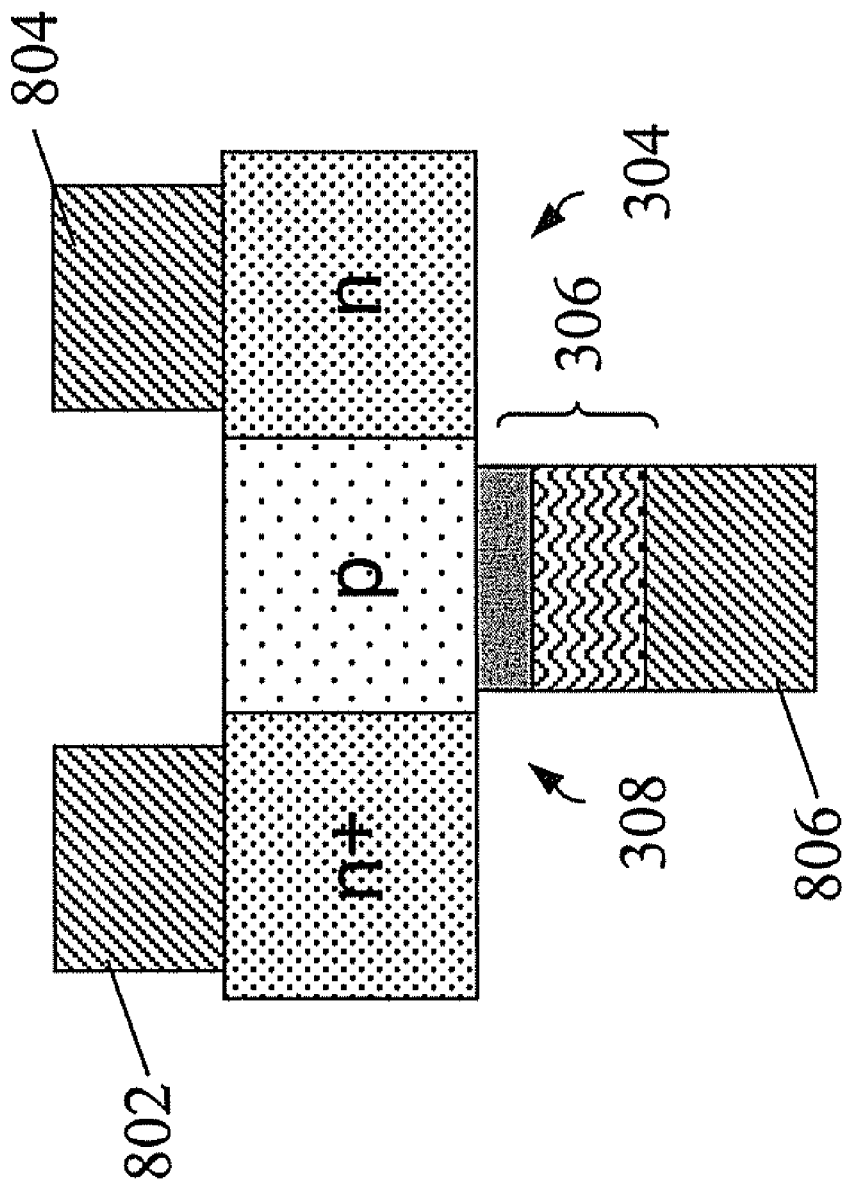
FIG. 8 is a side cross sectional view of the diode and PCM devices comprising an exemplary unit cell in the bipolar transistor array of FIG. 7.

FIG. 8 is a side cross sectional view of the diode and PCM devices comprising an exemplary unit cell 702 in the n-p-n array 700 of FIG. 7. As is shown, the polysilicon cell defines an n+-p-n device wherein the emitter terminal 802 is connected to the n+ region and the collector terminal is connected to the n region 804. The PCM element is connected at one end to the p region (transistor base) and at the other end to terminal 806. An exemplary process flow for forming the unit cell structure shown in FIG. 8 is presented hereinafter.

Figure 9:
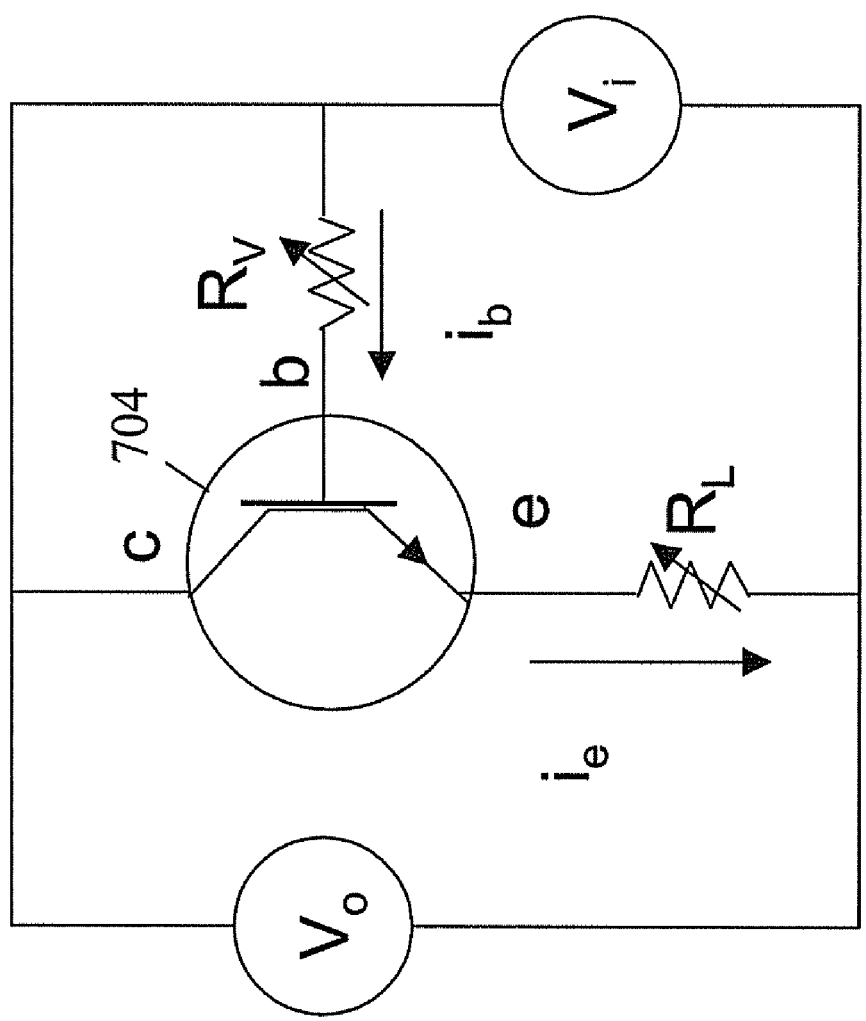
FIG. 9 is a schematic diagram illustrating the operation of the bipolar transistor of the array configuration of FIG. 7.

FIG. 9 is a schematic diagram illustrating the operation of the bipolar transistor 704 of the array configuration of FIG. 7, in the emitter-follower mode. The expression for the heating current in the ON and OFF phases of the PCM depends not only on the PCM ON and OFF resistances, but also on the transistor gain and the load resistance $R_L$. The load resistance $R_L$ may be used to adjust this ratio to the desired value. For example, for $\beta$ (transistor gain)=(5–500), then:

$$i_e = \beta V_i/(R_V + \beta R_L); \text{ and}$$

$$i_e^{ON}/i_e^{OFF} = (R_V^{OFF} + \beta R_L)/(R_V^{ON} + \beta R_L).$$

If, for example, $i_e^{ON}/i_e^{OFF} = N \sim 3-5$, then:

$R_L \sim R_V^{OFF}/(\beta(N-1))$. Further assuming a large $\beta$ of about 100, then $R_L$ may be on the order of about 1 K$\Omega$. The transistor current is roughly stabilized independent of whether the PCM device is in the ON or OFF state by negative feedback.

Simulation

For a RESET operation, a temperature rise in the layer of PCM in contact with the heater element of at least the PCM melt temperature (on the order of about 600° C.) is required. Also, this temperature needs to drop rapidly (on a nanosecond time scale) to ensure that amorphization, not recrystallization, occurs. In the GST ($Ge_2Sb_2Te_5$) material, recrystallization occurs by the relatively slow homogeneous nucleation process, facilitating amorphization. In other materials, heterogeneous recrystallization (i.e., re-invasion of the amorphous region by the crystalline/amorphous front growing out of the unmodified crystalline part of the sample) can limit amorphization if the front velocity is too fast. The velocity may be on the order of tens of meters per second. The temperature rise required for a SET operation is more modest (on the order of about 200° C.), but the SET requires a much longer cool time, perhaps up to about 500 ns for GST, to accomplish recrystallization.

Thus, the key requirements that may be demonstrated, and which may be tested by simulation, are the reasonableness of the heater temperature required to melt the PCM, the rapid drop in temperature required to amorphize the PCM, and the power requirement.

3D Simulations of Heat Flow

Thermal simulations are based on solving the thermal diffusion equation:

$$C_V dT/dt = \nabla K \nabla T + H$$

for the temperature $T(r,t)$, with specific heat at constant volume, $C_V$, diffusion coefficient, $K(T)$, and heating rate, $H(r,t)$. Material properties are taken as temperature-independent and typical for the corresponding materials. The melt temperature of PCM is assumed to be 607° C.

Figure 10:
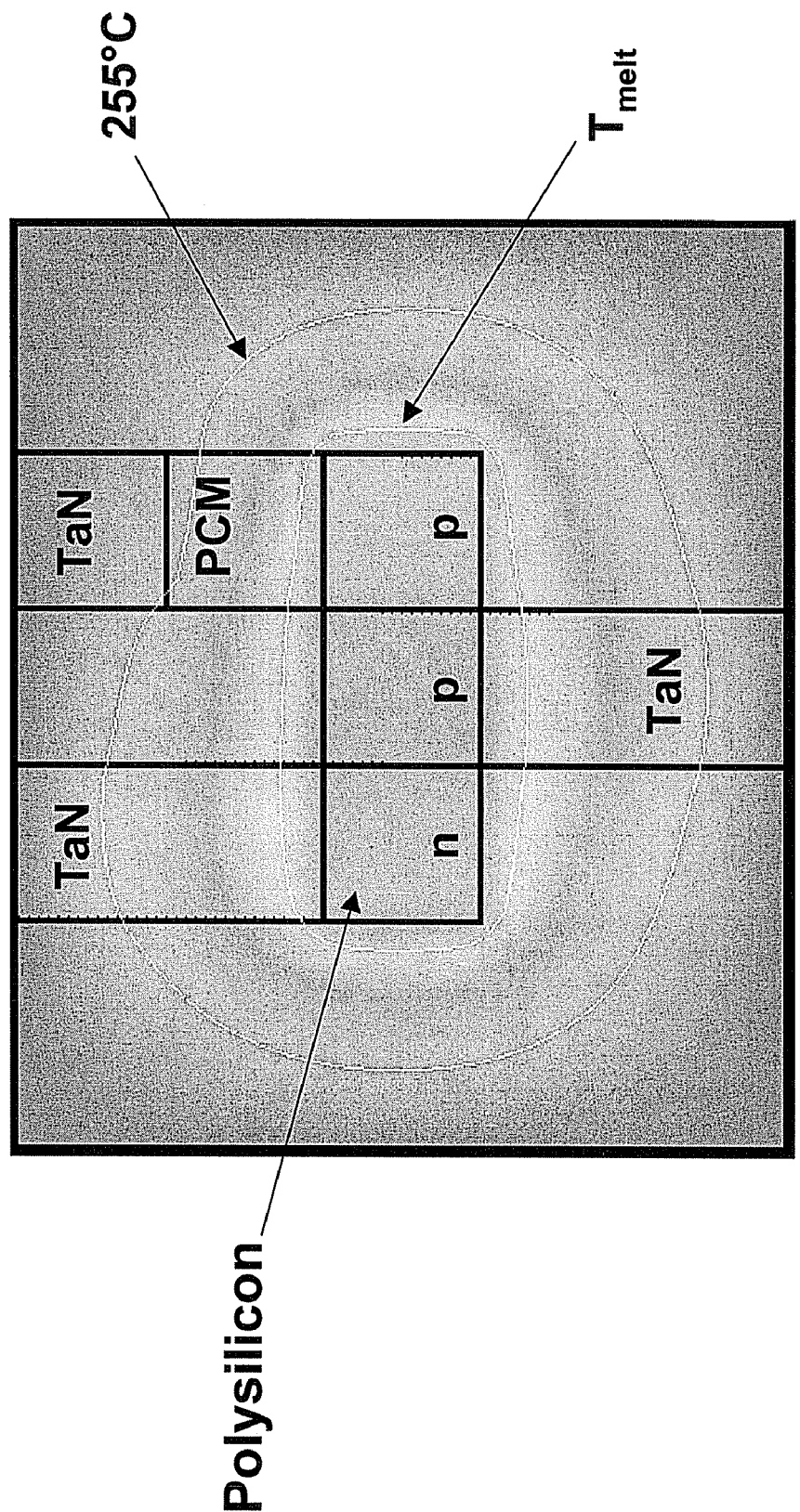
FIGS. 10-12 are temperature contour diagrams for side views of various configurations of p-n junctions subjected to 3D thermal simulations.
Figure 11:
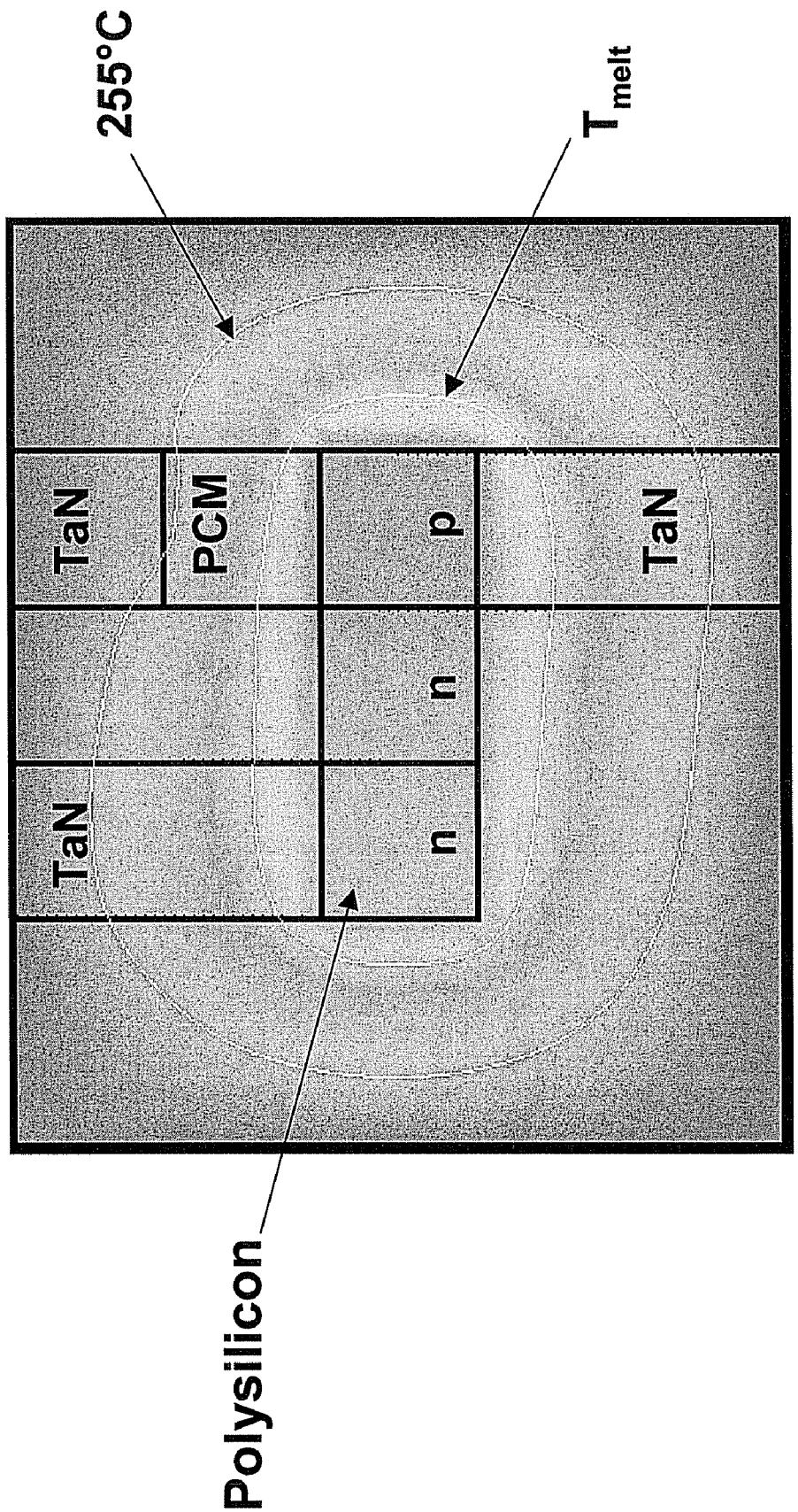
Figure 12:
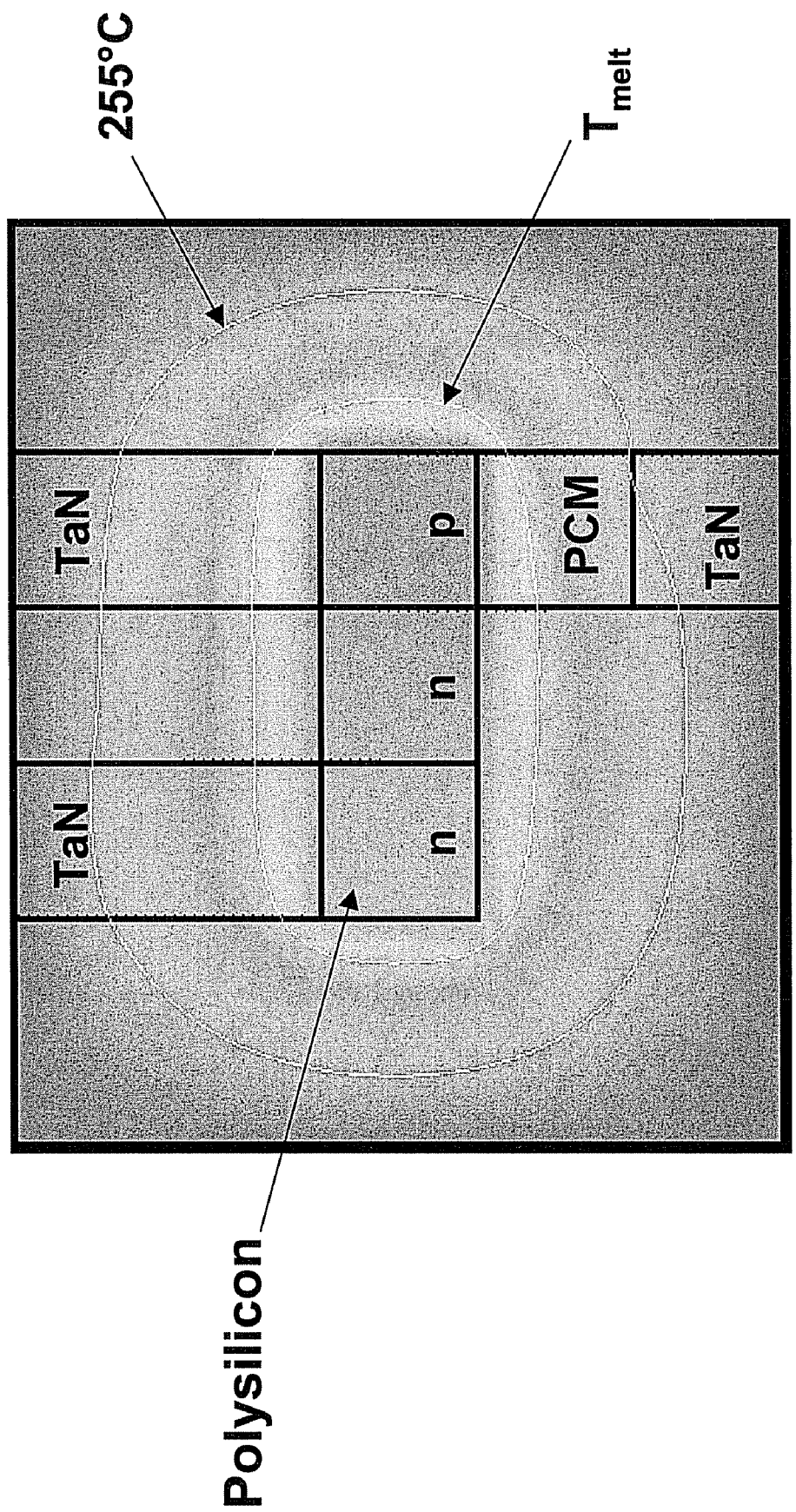

FIGS. 10-12 are temperature contour diagrams for side views of various configurations of p-n junctions subjected to 3D thermal simulations. In the diagram of FIG. 10, in terms of width (left to right), depth (front to back), and height, the outer dimensions of the device are 240×160×200 nm and the PCM dimensions are 40×40×40 nm. The polysilicon includes an n-p junction that contributes to the heat input. Other heat input comes from the resistance of poly-Si, which is assumed to be 2500 μΩ-cm and also from the resistance in the TaN wires, which is assumed to be 268 μΩ-cm. The peak temperature in the polysilicon in the SET (melt) phase is found to be 780° C., with the heater on for 5 ns at 0.7 mW. The current is 0.5 mA. The inner contour in FIG. 10 the melt temperature ($T_{melt}$). The melt front need only extend into the PCM material for a small distance away from the heater in order to break the electrical pathway from the sense voltage to the ground. The cool down time for the PCM to drop from its peak temperature to below the melt temperature is 0.2 ns, much shorter than the recrystallization time, as required for its transition into the amorphous phase.

FIG. 11 illustrates another 3D simulation with the same device dimensions but different junction configuration. The peak temperature in the polysilicon is 900° C. and the applied power used to melt the PCM is 0.9 mW for 5 ns; the cool-down time is 0.3 ns. The simulation of FIG. 12 illustrates a third configuration, which is a variation of FIG. 12 where the PCM is disposed below the polysilicon. The peak temperature in the polysilicon is 880° C. and the power used to melt the PCM is 0.9 mW for 5 ns; the cool-down time is 0.4 ns.

In addition, carrier-level simulations show that the maximum heat output is on the side of the junction corresponding to the lower dopant density, and thus represents the optimum location for the PCM contact.

2D Combined Electrical/Thermal Simulations

Figure 13:
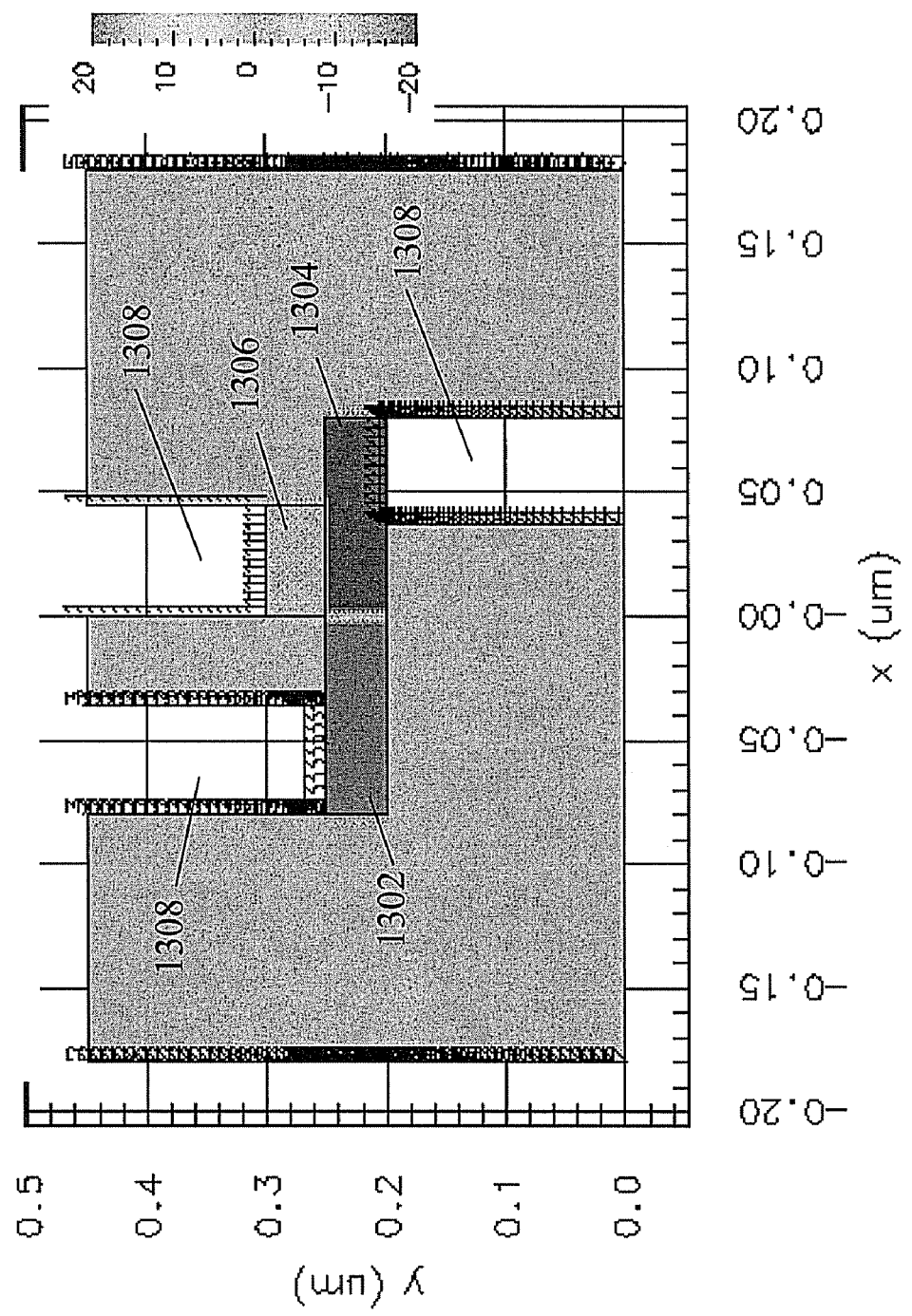
FIG. 13 is a map illustrating the n-dopant, p-dopant and PCM regions for p-n junctions subjected to 2D combined electrical and thermal simulations.
Figure 14:
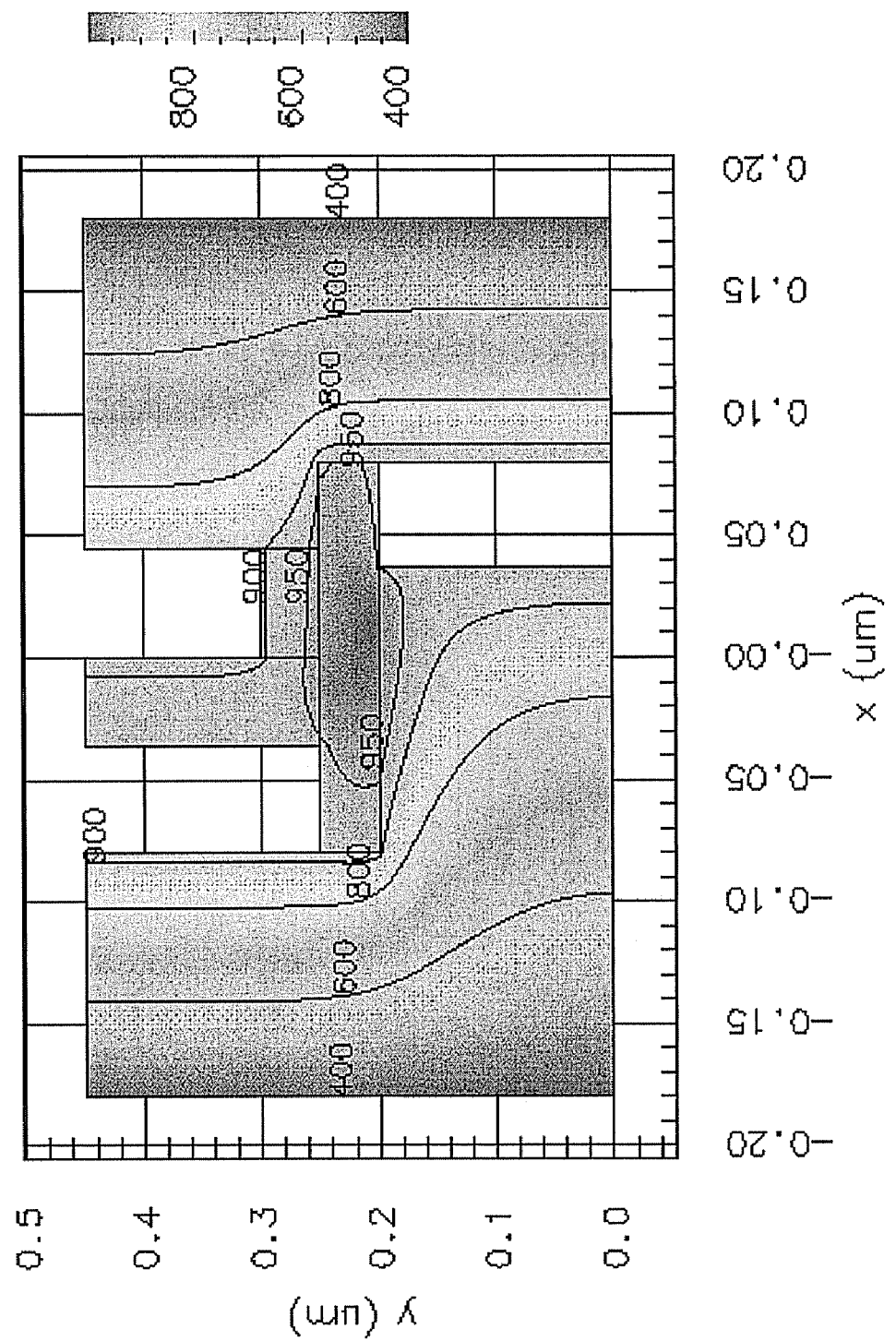
FIG. 14 is a resulting temperature contour diagram for the device shown in FIG. 13.

Referring now to FIGS. 13 and 14, a more realistic level of simulation treats the current flow through the p-n junction at the carrier level. FIG. 13 is a cross sectional view of a PCM device under simulation, showing the dimensions and boundary conditions of the p-type silicon, n-type silicon, PCM 1306 and contact regions 1308. At the highest operating temperatures, there is considerable carrier mobility degradation. However, using relatively high n-type doping concentrations of about $2 \times 10^{20}/cm^3$ and p-type doping concentrations of about $1 \times 10^{20}/cm^3$, adequate current flow can be achieved.

FIG. 14 illustrates that at silicon temperatures on the order of about 996 K (723° C.), current densities on the order of about 66 A/cm (device width) are obtained using an applied power of about 0.66 mW at an operating voltage of about 2 volts. The medium (thermal bath) into which the sample device was inserted provided a fixed thermal boundary condition of about $T_0 = 400K$ at left and right ends thereof.

In the simulation depicted, the PCM has (length×thickness) dimensions of 45 nm×50 nm, the n-region has dimensions of 80 nm×50 nm with a doping of $2 \times 10^{20}/cm^3$, and the p-region has dimensions of 80 nm×50 nm with a doping of $1 \times 10^{20}/cm^3$. The contact length is 50 nm, having a thermal resistance (TR)=100 [K/W]-cm. The thermal resistance is a measure of the capability of the contact to dissipate heat from the sample to the external environment. Further, the thermal conductivity of the amorphous GST material is $2.0 \times 10^{-3}$ W/cm-K, while for the GST material in crystalline form, the thermal conductivity is $4.63 \times 10^{-3}$ W/cm-K. The device pitch is about 360 nm, corresponding to a memory array simulation, and a reflect boundary condition is assumed on the top/bottom boundaries, meaning that heat does not across the boundaries.

As thus shown in FIGS. 13 and 14, the carrier-level simulations demonstrate that the maximum heat output is on the side of the junction corresponding to the lower dopant density, and accordingly will correspond to the optimum location for the PCM contact.

Materials Issues

Generally speaking, the multilayer memory embodiments using PCM elements involves the repeated deposition of polysilicon, suitably patterned and implanted to form highly doped p-n junctions serving as heater and sense elements in the memory cells described herein. In order to form junctions with low leakage, silicon grains should be sufficiently large so that there are preferably no grain boundaries within the junction. One way to obtain this feature is to first to deposit a polysilicon layer of a thickness comparable to the desired grain size, since this is the maximum grain size that can be achieved by an appropriate annealing schedule. This layer can be subsequently etched back to the design specifications. During the pre-amorphization step (e.g., low dose, typically about $3 \times 10^{14}$, germanium implant) in the practiced implantation process, the energy may be chosen such that there is a thin polycrystalline layer (adjacent to the bottom interface) left intact. This will ensure that in the subsequent post-implant activation anneal steps the re-crystallization is nucleated from that thin interface, thus retaining the originally established polysilicon grain size. Grains may be grown as large as about 120 nm, but for the smaller feature sizes smaller grains may suffice.

The implant doses should be as high as possible, chosen as per the device design, up to the maximum dopant solubility in silicon and maximum that can be effectively activated (i.e., transferred from the interstitial to the silicon lattice sites). For the implant (e.g., boron, phosphorous, arsenic) activation anneals, fast laser anneals (e.g., about 1200° C.-1300° C. for about 0.2-0.8 ms) are preferred since they will primarily act on the top layer of the multilayer structure containing PCM transformable vias. The depth of the heat distribution (presently at the level of a gate stack, e.g., about 2 microns) will depend on, and presumably could be adjusted by, the laser beam profile. These anneals are currently done by linear scans using (in some cases for heating uniformity) a sacrificial (e.g., 400-600 nm thick) carbon absorber layer which is subsequently ashed away. Presently, diffusion and adjusting of the dopant profile is achieved by rapid thermal anneal (RTA)

(about 800° C.-900° C., second time scale), although laser anneals may be parameterized to accomplish this step as well.

Another possible processing route includes fabricating the silicon and oxide layers using an oxygen implantation process for creating buried oxide within the epi-Si layers. This process is practiced in silicon-on-insulator (SOI) chips and is considered to be the future for CMOS, with a smaller defect density than, for example, silicon-on-sapphire (SOS). For example, by implanting oxygen with the dose of about $2 \times 10^{18}/cm^2$, an estimated oxide thickness is greater than about 200 nm, and oxide thicknesses in the range of about 40-100 nm have been reported. Silicon may be doped during the deposition process and subsequently patterned according to the cell design.

Still another route may involve creating Schottky barrier diodes at the interfaces of Si with the contact electrodes. This route would make use of graded doping profiles in silicon and tailoring (by an appropriate annealing protocol) the dopant distribution to have a reduced doping level at the Si-metal interface. The metal in contact with silicon should have sufficiently low thermal conductivity, good thermal stability, and be a good diffusion barrier, e.g., TaN, TaSiN. This route will avoid formation of abrupt vertical p-n junctions formed by Si-doping through various masking levels and may be advantageous at smaller feature sizes.

Manufacture

Figure 15C:
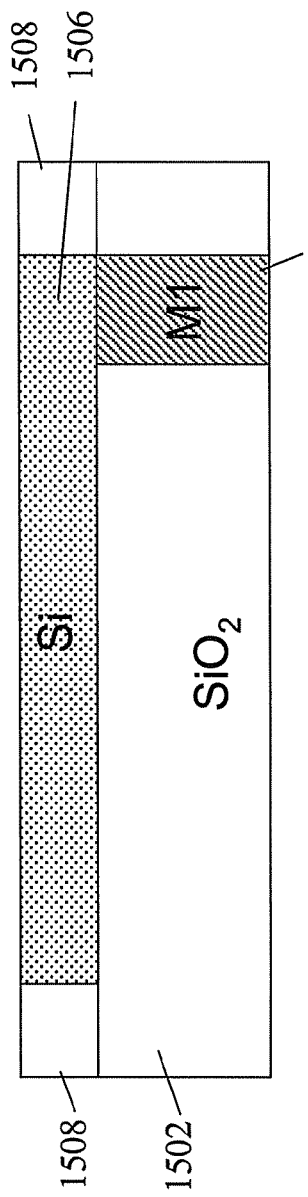
FIGS. 15($a$) through 15($h$) are cross sectional views illustrating an exemplary method of forming the crossbar array cell of FIGS. 4($a$) and 4($b$)

Referring now to FIGS. 15(a) through 15(h), there are shown cross sectional views illustrating an exemplary method of forming the crossbar array cell of FIGS. 4(a) and 4(b). In this example, standard CMOS processing is performed up to M1 metal level. As shown in FIG. 15(a), the M1 dielectric layer 1502 may be a low-temperature silicon dioxide ($SiO_2$) material, for example, or alternately an organic material such as SiCOH. An M1 via 1504 is shown formed in dielectric layer 1502. In FIG. 15(b), a polysilicon layer 1506 is formed over the M1 layer.

Figure 15D:
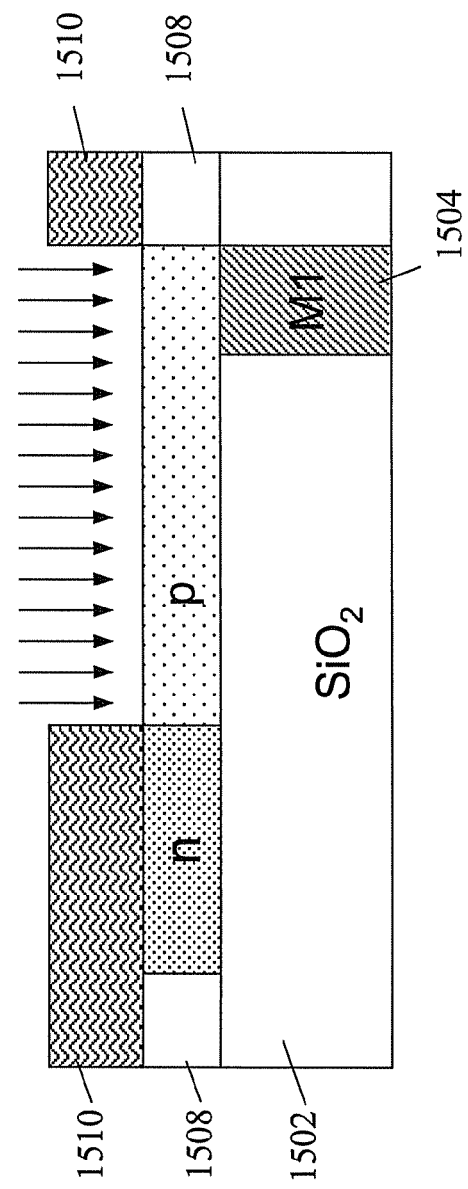
Figure 15G:
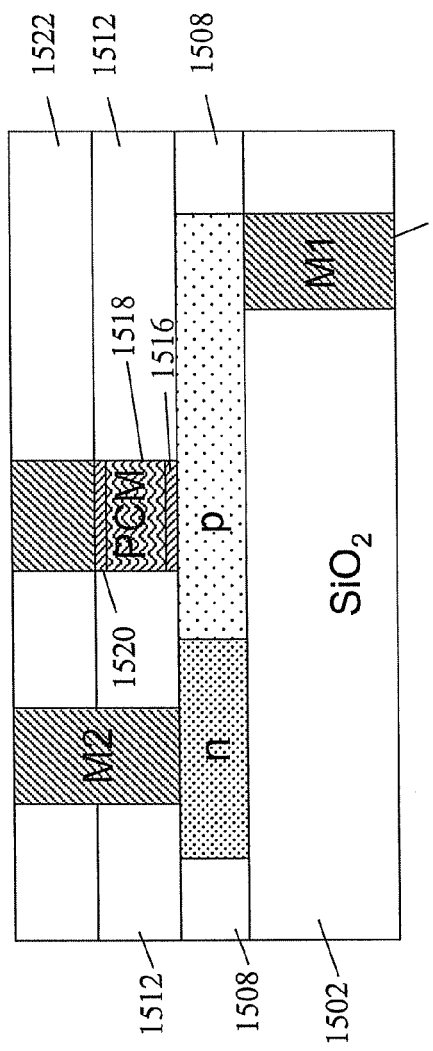

As shown in FIG. 15(c), the polysilicon layer 1506 is patterned to define the heater and sensor diode areas. This is followed by the deposition of additional dielectric, such as $SiO_2$, and by a planarization step (e.g., chemical mechanical polishing (CMP)) to result in insulating regions 1508. Then, in FIG. 15(d), a plurality of masking steps using a photoresist layer (e.g., layer 1510) are used to define the n and p-regions using suitable dopant implant materials (e.g., As and B). In particular, FIG. 15(d) shows implantation of the p-region. The pre-amorphization step as described above (e.g., low dose germanium implant) is also performed after polysilicon patterning and prior to the n and p-region formations. After pre-amorphization and n/p implantation, the device is annealed in order to activate the dopant materials.

Figure 15H:
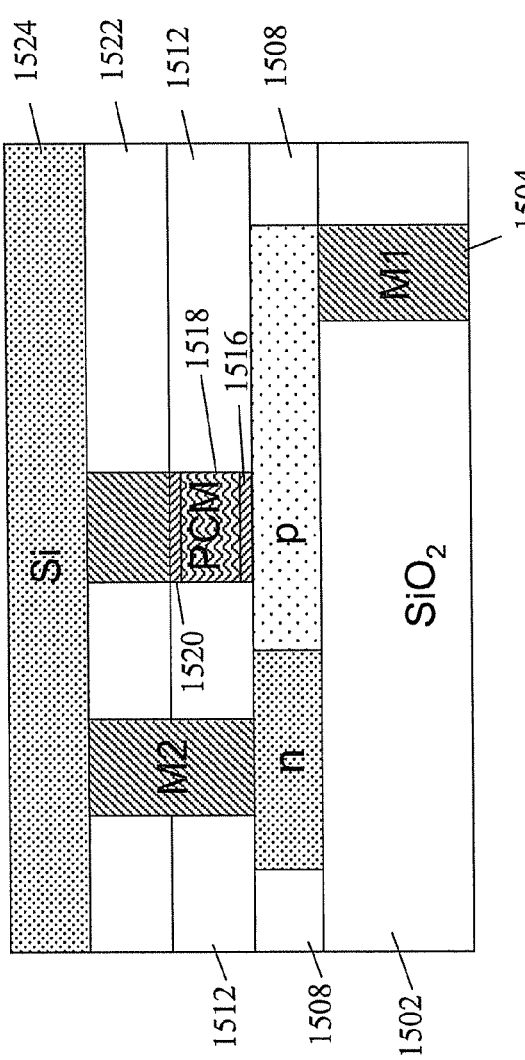

As next shown in FIG. 15(e), another dielectric layer 1512 (e.g., $SiO_2$) is deposited, followed by patterning and etching of a via 1514 to be filled with PCM, capping and adhesion layers. In FIG. 15(f), the via is filled with a stack including a TaN/Ta or TiN/Ti adhesion/barrier layer 1516 (e.g., 1 nm thickness), a PCM layer 1518, and another TaN/Ta or TiN/Ti adhesion/barrier layer 1520 (e.g., 1 nm thickness). The resulting structure is then planarized by CMP, and in FIG. 15(g), the next dielectric layer 1522 is deposited in which the contact vias for the next metal level are defined. These contact vias (M2) may be lined with TaN and filled with Cu (a standard CMOS process) or filled with tungsten (W). Finally, the multilayer process starts anew with the deposition of the next polysilicon layer 1524, as shown in FIG. 15(h).

Figure 16A:
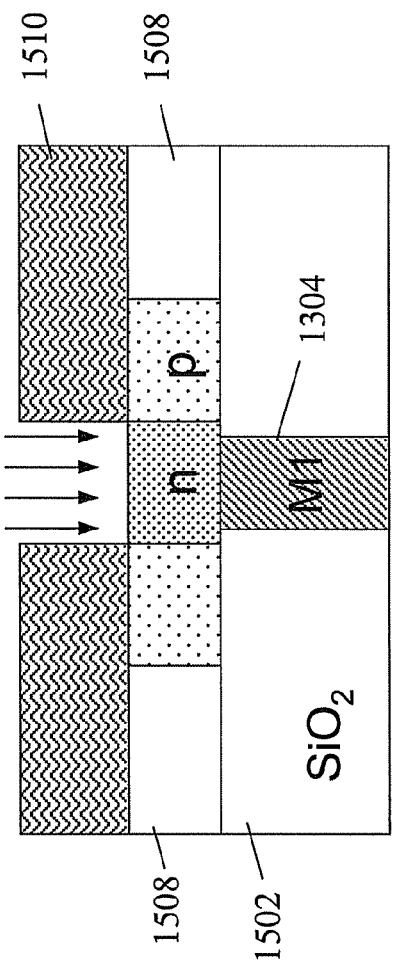
FIGS. 16($a$) and 16($b$) are cross sectional views illustrating an exemplary method of forming the p-n-p array cell of FIG. 6.
Figure 16B:
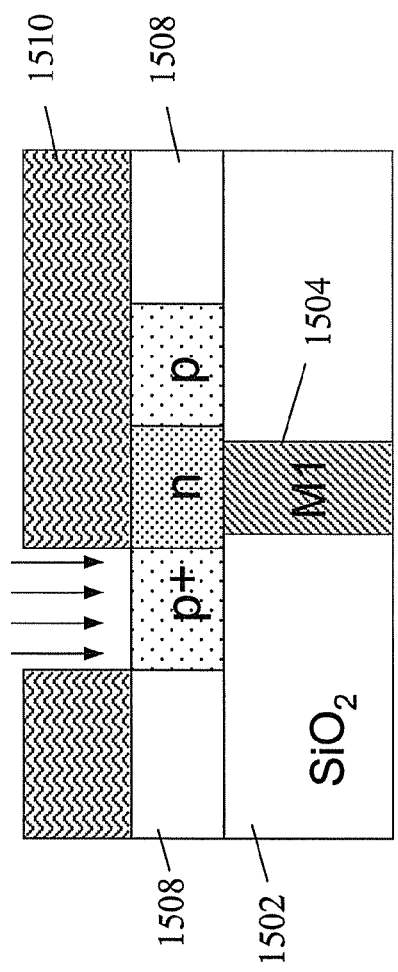

FIGS. 16(a) and 16(b) are cross sectional views illustrating an exemplary method of forming the p-n-p array cell of FIG. 6. While the bulk of the processing is the same as that for the first embodiment (e.g., FIG. 15(d)), the masking and patterning of the polysilicon layer is modified to form three vertical p-n-p junctions, with the PCM stack placed over the p-region. In other words, an additional masking level is used to form three vertical p-n junctions by three separate implant and annealing steps.

Figure 17A:
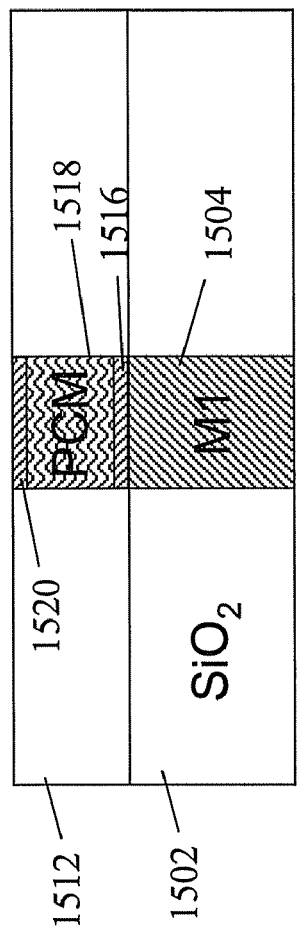
FIGS. 17($a$) through 17($g$) are cross sectional views illustrating an exemplary method of forming the bipolar transistor array cell of FIG. 8.

FIGS. 17(a) through 17(g) are cross sectional views illustrating an exemplary method of forming the bipolar transistor array cell of FIG. 8. Again, in this embodiment, a bipolar transistor is configured to serve as both a heater and a sensor element. Up to the M1 level, standard CMOS processing is employed, as is the case with the first two embodiments. Here, however, instead of forming a polysilicon layer directly upon the M1 dielectric layer 1502, the PCM level dielectric layer 1512 is formed directly upon the M1 dielectric layer 1502, as shown in FIG. 17(a). As also shown in FIG. 17(a), the PCM level dielectric layer 1512 is patterned, etched and filled so as to form the PCM structure 1516/1518/1520 described above in reference to FIG. 15(f). In other words, the PCM stack is formed upon the M1 contact via 1504, and is located under the three vertical n-p-n junctions, and in particular under the subsequently formed p region at the base of the transistor.

Figure 17B:
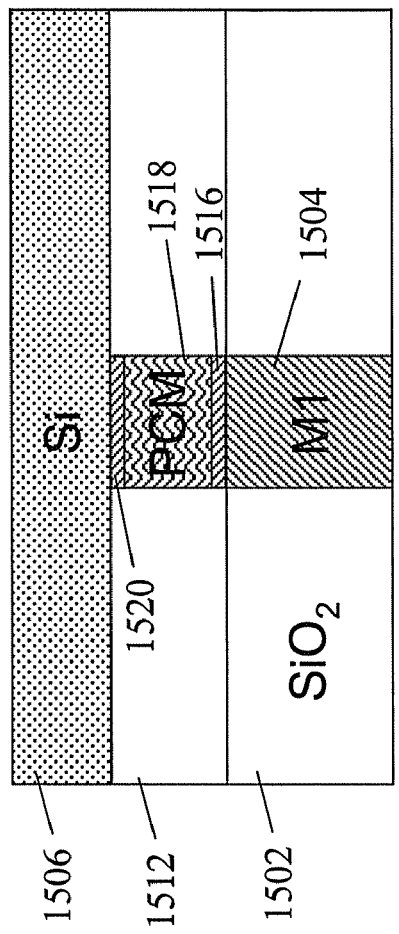
Figure 17C:
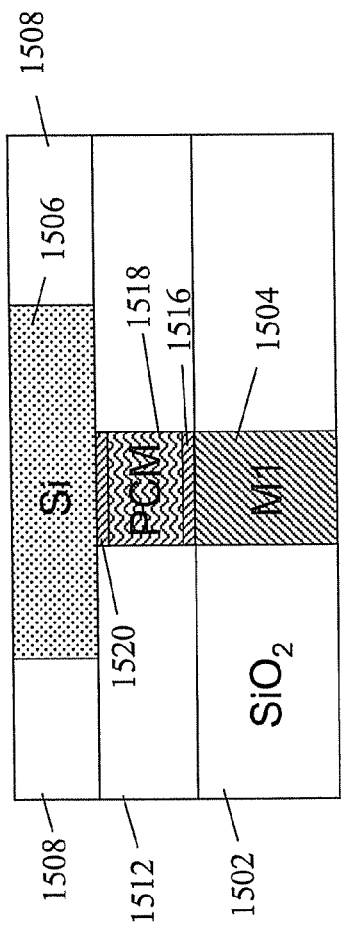
Figure 17D:
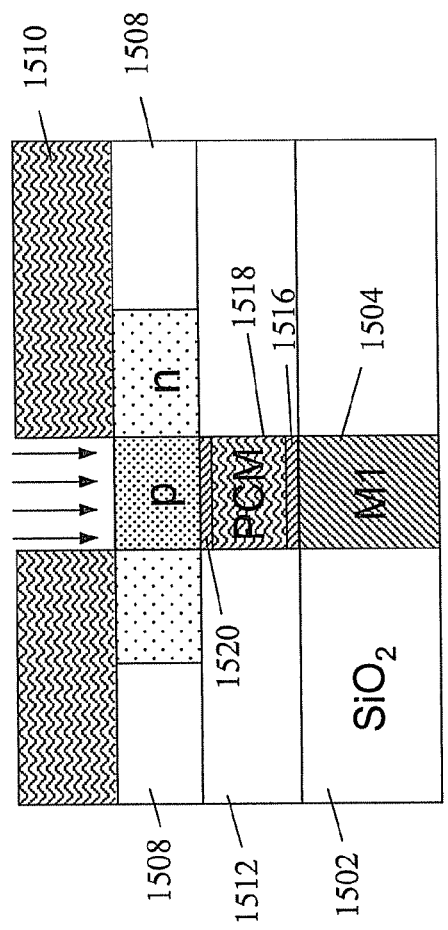
Figure 17E:
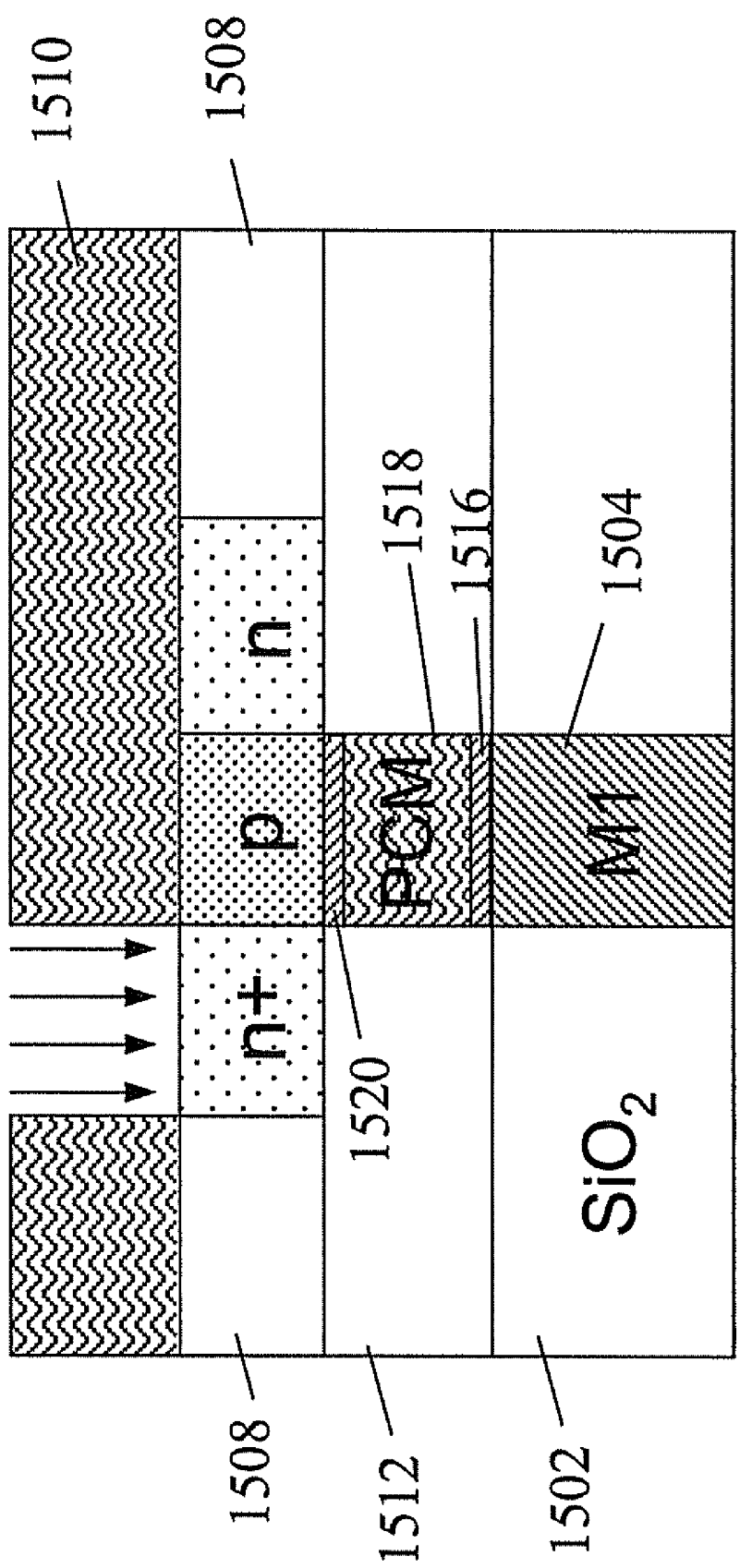

Thus, as shown in FIG. 17(b), the polysilicon layer 1506 is deposited over the PCM stack and patterned to define the subsequently formed transistor regions, followed by formation and planarization of additional dielectric 1508 as shown in FIG. 17(c). Similar to the masking and patterning of the second embodiment, the bipolar transistor areas are defined and patterned using photoresist layers 1510 as shown, for example in FIGS. 17(d) and 17(e). This is followed by a deposition of the next dielectric layer 1522 in which the contact vias to the next metal level (M2) are defined. Again, these M2 contact vias can be lined with TaN and filled with Cu or filled with W. Finally, the multilayer process starts anew with the deposition of the next polysilicon layer 1524, as shown in FIG. 17(h).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A multi-layer, phase change material (PCM) memory apparatus, comprising:

a plurality of semiconductor layers sequentially formed over a base substrate, wherein each layer comprises an array of memory cells formed therein, each memory cell further comprising a PCM element, a first diode serving as a heater diode in thermal proximity to the PCM element and configured to program the PCM element to one of a low resistance crystalline state and a high resistance amorphous state, and a second diode serving a sense diode for a current path used in reading the state of the PCM element;

the base substrate further comprising decoding, programming and sensing circuitry formed therein, with each of the plurality of semiconductor layers spaced by an insulating layer; and intralayer wiring for communication between the base substrate circuitry and the array of memory cells in each of the semiconductor layers.

2. The apparatus of claim 1, wherein the heater diode comprises a first p/n junction and the sense diode comprises a second p/n junction laterally spaced from the first p/n junction in the corresponding semiconductor layer, wherein the heater diode is oppositely biased with respect to the sense diode, and wherein the sense diode is electrically connected in series with respect to the PCM element.

3. The apparatus of claim 2, wherein an n-region of the heater diode and a p-region of the sense diode are coupled to a row line of the array, and a p-region of the heater diode and the PCM element are coupled to a column line of the array.

4. The apparatus of claim 3, wherein the PCM element is written by grounding the row line of the array and applying a positive voltage to the column line of the array, the positive voltage being less then twice the value of a diode threshold voltage so as to prevent undesired current paths through memory cells of the array not being written.

5. The apparatus of claim 3, wherein the state of the PCM element is read by grounding the column line of the array and applying a positive voltage to the row line of the array, the positive voltage being less then twice the value of a diode threshold voltage so as to prevent undesired current paths through memory cells of the array not being written, and wherein a resulting sense current passed through the PCM element being read is sensed by a sense amplifier coupled to the column line of the array.

6. The apparatus of claim 3, wherein the PCM element is formed atop the p-region of the heater diode.

7. The apparatus of claim 1, wherein the heater diode and the sense diode together form one of a p-n-p device or an n-p-n device that share a common n or p-region.

8. The apparatus of claim 7, wherein:
a p-region of the heater diode is coupled to a first of a pair of row lines included within each row of the array;
the heater diode and the sense diode share a common n-region, which is coupled to a column line of the array; and
a p-region of the sense diode is coupled to one end of the PCM element, with the other end of the PCM element coupled to a second of the pair of row lines;
wherein the p-region of the heater diode is doped at a higher concentration with respect to the p-region of the sense diode.

9. The apparatus of claim 8, wherein the PCM element is written by grounding the column line of the array, applying a positive voltage to the first of the pair of row lines of the array, and allowing remaining lines of the array to float.

10. The apparatus of claim 8, wherein the state of the PCM element is read by grounding the column line of the array and applying a positive voltage to the second of the pair of row lines of the array, and wherein a resulting sense current passed through the PCM element being read is sensed by a sense amplifier coupled to the column line of the array.

11. The apparatus of claim 8, wherein the PCM element is formed atop the p-region of the sense diode.

12. The apparatus of claim 7, wherein:
an n-region of the sense diode is coupled to a first of a pair of column lines included within each column of the array;

the heater diode and the sense diode share a common p-region, which is coupled to one end of the PCM element, with the other end of the PCM element coupled to a row line of the array; and
an n-region of the heater diode is coupled to a second of the pair of column lines;
wherein the arrangement of the sense diode, heater diode and PCM element define a bipolar transistor with a base terminal thereof corresponding to the common p-region, a collector terminal thereof corresponding to the n-region of the heater diode, and an emitter region thereof corresponding to the n-region of the sense diode, and wherein the n-region of the sense diode is doped at a higher concentration with respect to the n-region of the heater diode.

13. The apparatus of claim 12, wherein the PCM element is written by applying a first positive voltage to the row line of the array, applying a second larger positive voltage to the second of the pair of column lines, and allowing remaining lines of the array to float.

14. The apparatus of claim 12, wherein the state of the PCM element is read by applying a first positive voltage to the row line of the array, applying a second larger positive voltage to the second of the pair of column lines, and grounding remaining lines of the array, and wherein a resulting sense current passed through the PCM element being read is sensed by a sense amplifier coupled to the second of the pair of column lines of the array.

15. The apparatus of claim 12, further comprising an emitter load resistor coupled to each of the first of the pair of column lines of the array so as to provide negative current feedback to the bipolar transistor.

16. The apparatus of claim 15, wherein the load resistor also comprises a programmable PCM element.

17. The apparatus of claim 12, wherein the PCM element is formed below the common n-region.

18. A method of forming a multi-layer, phase change material (PCM) memory device, the method comprising:
sequentially forming a plurality of semiconductor layers over a base substrate, wherein each layer comprises an array of memory cells formed therein, each memory cell further comprising a PCM element, a first diode serving as a heater diode in thermal proximity to the PCM element and configured to program the PCM element to one of a low resistance crystalline state and a high resistance amorphous state, and a second diode serving a sense diode for a current path used in reading the state of the PCM element;
forming decoding, programming and sensing circuitry in the base substrate, with each of the plurality of semiconductor layers spaced by an insulating layer; and
forming intralayer wiring for communication between the base substrate circuitry and the array of memory cells in each of the semiconductor layers.

19. The method of claim 18, wherein the heater diode comprises a first p/n junction and the sense diode comprises a second p/n junction laterally spaced from the first p/n junction in the corresponding semiconductor layer, wherein the heater diode is oppositely biased with respect to the sense diode, and wherein the sense diode is electrically connected in series with respect to the PCM element.

20. The method of claim 18, wherein the heater diode and the sense diode together form one of a p-n-p device or an n-p-n device that share a common n or p-region.

* * * * *